(12) United States Patent
Cho et al.

(10) Patent No.: US 11,031,452 B2
(45) Date of Patent: Jun. 8, 2021

(54) DISPLAY PANEL

(71) Applicant: Samsung Display Co., Ltd., Yongin-si (KR)

(72) Inventors: Seung-Hwan Cho, Yongin-si (KR); Doo Hwan Kim, Yongin-si (KR); Tae Jin Kim, Bucheon-si (KR); Tae Hyun Kim, Seoul (KR); Joo Sun Yoon, Seoul (KR); Min Jae Jeong, Hwaseong-si (KR); Jong Hyun Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/200,477

(22) Filed: Nov. 26, 2018

(65) Prior Publication Data
US 2019/0172890 A1    Jun. 6, 2019

(30) Foreign Application Priority Data

Dec. 4, 2017  (KR) .................. 10-2017-0165361

(51) Int. Cl.
*H01L 27/32*    (2006.01)
*H01L 51/52*    (2006.01)
(Continued)

(52) U.S. Cl.
CPC ....... *H01L 27/3276* (2013.01); *G09G 3/3233* (2013.01); *H01L 27/3223* (2013.01);
(Continued)

(58) Field of Classification Search
CPC ............... H01L 27/124; H01L 27/3276; H01L 27/3279; H01L 27/3223; H01L 27/3241;
(Continued)

(56) References Cited

U.S. PATENT DOCUMENTS 9,626,900 B2 *   4/2017   Anzai .................. G09G 3/3648
2015/0236297 A1   8/2015   Hong et al.
(Continued)

FOREIGN PATENT DOCUMENTS

KR   10-2012-0017928 A   2/2012
KR   10-2014-0053626 A   5/2014
(Continued)

OTHER PUBLICATIONS

Partial European Search Report for corresponding European Patent Application No. 18207962.4, dated Apr. 2, 2019, 20 pages.

*Primary Examiner* — Natalia A Gondarenko
(74) *Attorney, Agent, or Firm* — Lewis Roca Rothgerber Christie LLP

(57) ABSTRACT

A display panel includes a first substrate having a display area and a peripheral area. The display area includes pixels with first output wires connected to the pixels. A first driver is connected to the first output wires and positioned in the peripheral area at a first side of the display area. The first substrate includes a notch portion having a curved edge and the display area has a first display portion and a second display portion with the notch portion therebetween. At least one of the first output wires is a first main line at the first display portion, a second main line at the second display portion, and a first connecting line that is connected to the first main line and the second main line and is at the peripheral area between the first display portion and the second display portion.

16 Claims, 20 Drawing Sheets

(51) Int. Cl.
| | | |
|---|---|---|
| *G09G 3/3233* | (2016.01) | |
| *G09G 3/32* | (2016.01) | |
| *G09G 3/3266* | (2016.01) | |
| *G09G 3/36* | (2006.01) | |
| *H01L 27/12* | (2006.01) | |

(52) U.S. Cl.
CPC ...... *H01L 27/3251* (2013.01); *H01L 51/5246* (2013.01); *G09G 3/32* (2013.01); *G09G 3/3266* (2013.01); *G09G 3/3674* (2013.01); *G09G 2300/0408* (2013.01); *G09G 2300/0413* (2013.01); *G09G 2300/0426* (2013.01); *G09G 2300/0861* (2013.01); *G09G 2310/0251* (2013.01); *G09G 2310/0262* (2013.01); *H01L 27/124* (2013.01)

(58) Field of Classification Search
CPC ............. H01L 27/3244; H01L 27/3246; H01L 27/3251; H01L 51/5246; H01L 2924/10156; H01L 2924/10161; H01L 2924/12044; H01L 2924/386; H01L 2225/065; H01L 2225/06506; H01L 2225/0651; H01L 2225/06524; H01L 2227/32; H01L 2224/45032; H01L 2224/47; H01L 2224/481; H01L 2224/48137; H01L 2224/49109; H01L 2224/49176; G09G 2300/0408; G09G 2300/0861; G09G 2300/0426; G09G 2300/0413; G09G 3/3674; G09G 3/3233; G09G 3/3266; G09G 3/32; G09G 2310/0251; G09G 2310/0262; G09G 3/3208; G09G 3/3648; G09F 9/33; G09F 9/35
USPC ....................................... 257/88, 72; 438/30
See application file for complete search history.

(56) References Cited

U.S. PATENT DOCUMENTS

| | | | |
|---|---|---|---|
| 2015/0270291 A1 | 9/2015 | Tian et al. | |
| 2017/0301280 A1 | 10/2017 | Ka et al. | |
| 2018/0113566 A1* | 4/2018 | Shigemori | G06F 3/04886 |
| 2018/0190190 A1* | 7/2018 | Xi | G09G 3/3225 |
| 2019/0121211 A1* | 4/2019 | Luo | H01L 27/3279 |
| 2019/0131360 A1* | 5/2019 | Lee | G09G 3/3233 |
| 2019/0164489 A1* | 5/2019 | Zhang | G09G 3/3266 |

FOREIGN PATENT DOCUMENTS

| | | |
|---|---|---|
| KR | 10-2017-0013481 A | 2/2017 |
| KR | 10-2017-0034078 A | 3/2017 |

* cited by examiner

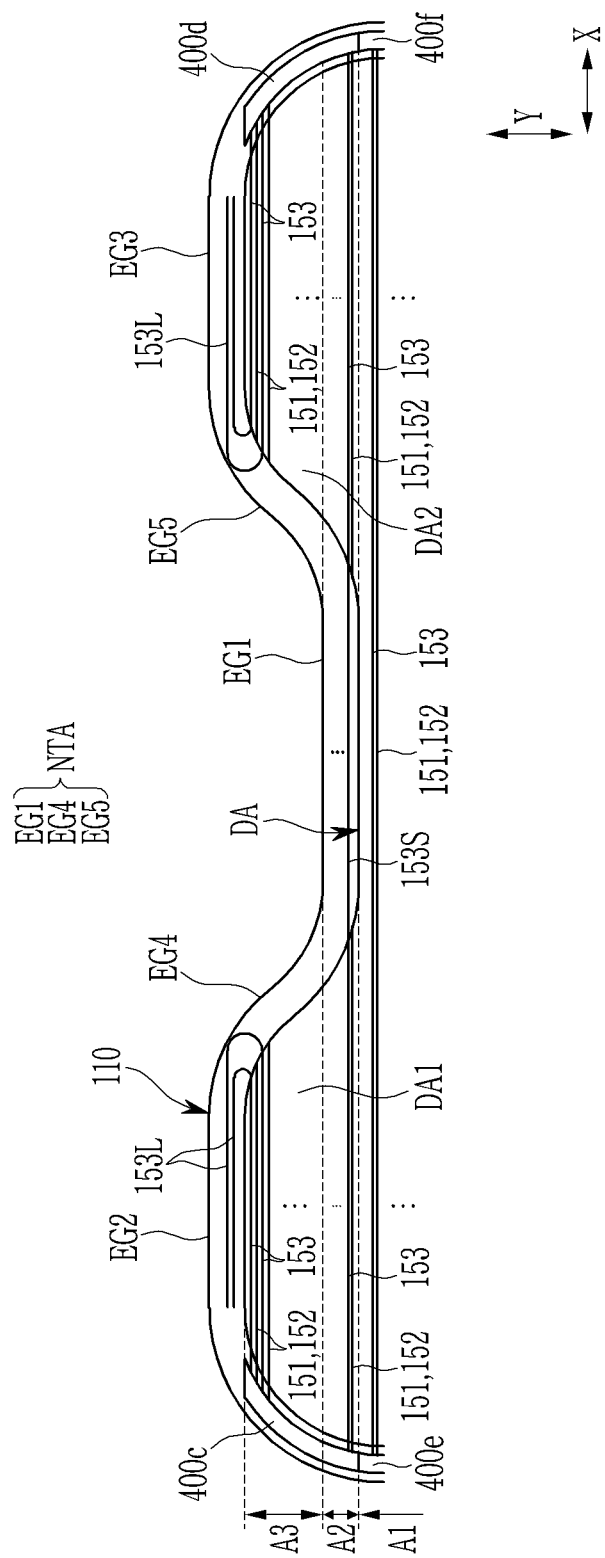

DISPLAY PANEL

CROSS-REFERENCE TO RELATED APPLICATION

This application claims priority to and the benefit of Korean Patent Application No. 10-2017-0165361 filed in the Korean Intellectual Property Office on Dec. 4, 2017, the entire contents of which are incorporated herein by reference.

BACKGROUND

1. Field

The present disclosure relates to a display panel.

2. Description of the Related Art

Display devices such as a liquid crystal display (LCD), an organic light emitting diode (OLED) display, and the like, include a display panel including a plurality of pixels for displaying an image and the plurality of signal lines. Each pixel may include a pixel electrode for receiving a data signal, and the pixel electrode may be connected to at least one transistor to receive the data signal. The display panel may include a plurality of layers stacked on a substrate.

The display panel includes a driver for applying a driving signal to the plurality of signal lines to apply the data signal to the pixel electrode, and the driver includes a gate driver for applying a scan signal to the plurality of pixels. The gate driver may be positioned in a peripheral area outside a display area in which the plurality of pixels are disposed, and may be connected to a plurality of scan lines connected to the plurality of pixels.

The above information disclosed in this Background section is only for enhancement of understanding of the background of the invention, and therefore it may contain information that does not form prior art.

SUMMARY

The present invention has been made in an effort to provide a display panel that may reduce an area of a peripheral region in which a gate driver is positioned in a display panel including a notch portion of a shape in which some of one end of a substrate is eliminated.

An exemplary embodiment of the present invention provides a display panel including: a first substrate including a display area and a peripheral area outside the display area; a plurality of pixels at the display area; a plurality of first output wires connected to the plurality of pixels; and a first driver positioned in a first peripheral area of the peripheral area at a first side with respect to the display area, the first driver being connected to the plurality of first output wires, wherein the first substrate may include a notch portion having a curved edge, the display area may include a first display portion and a second display portion that are spaced apart from each other with the notch portion interposed between the first display portion and the second display portion, and at least one of the plurality of first output wires may include a first main line at the first display portion, a second main line at the second display portion, and a first connecting line that is connected to the first main line and the second main line and is at the peripheral area between the first display portion and the second display portion.

At least one of the first main line and the second main line may extend in a first direction, and the notch portion may have a first edge, and a second edge and a third edge that are respectively at opposite sides with respect to the first edge and respectively extending in a direction crossing the first direction.

The first connecting line may include a portion extending along the notch portion.

The display panel may further include a second substrate opposing the first substrate, and a seal between the first substrate and the second substrate and bonding the first substrate and the second substrate with each other, wherein the first connecting line may overlap the seal.

The display panel may further include a voltage transmitting line in the peripheral area, the voltage transmitting line extending along at least three edges of the display area and transmitting a common voltage, wherein the first connecting line may overlap the voltage transmitting line.

The display panel may further include: a plurality of second output wires connected to the plurality of pixels; and a second driver positioned at a second side opposing the first side with respect to the display area in the peripheral area, the second driver being connected to the plurality of second output wires, wherein the second driver may have an asymmetrical structure with respect to the first driver.

At least one of the plurality of second output wires may include a third main line at the first display portion, a fourth main line at the second display portion, and a second connecting line connected to the third main line and the fourth main line, the second connecting line being at the peripheral area between the first display portion and the second display portion.

At least one of the third main line and the fourth main line may be connected to a dummy line at the peripheral area, the dummy line including a portion extending parallel to the third main line or the fourth main line.

The first connecting line and the second connecting line may be at a same conductive layer over the first substrate.

The first connecting line and the second connecting line may be at different conductive layers from each other over the first substrate.

The first connecting line and the second connecting line that are sequentially arranged in a plan view may be alternately positioned at the different conductive layers.

The first connecting line and the second connecting line may overlap each other in the plan view, and are positioned at different conductive layers from each other.

The first output wire may include a scan line or a control line.

Another embodiment of the present invention provides a display panel including: a first substrate including a display area and a peripheral area outside the display area; a plurality of pixels positioned in the display area; a plurality of output wires connected to the plurality of pixels; a first driver at a first peripheral area of the peripheral area at a first side with respect to the display area, the first driver being connected to a first output wire in a first region of the display area from among the plurality of output wires; a second driver at a second peripheral area of the peripheral area at a second side opposing the first side with respect to the display area; a third driver at the first peripheral area, the third driver being connected to a second output wire at a first display portion of the display area from among the plurality of output wires; and a fourth driver at the second peripheral area, the fourth driver being connected to a third output wire at a second display portion of the display area from among the plurality of output wires, wherein the first display portion and the second display portion may be different regions from the first region, the first driver and the second driver may have structures that are asymmetrical to each other, and the third driver and the fourth driver may have structures that are symmetrical to each other.

The first substrate may include a notch portion having a curved edge, and the first display portion and the second display portion may be spaced apart from each other interposing the notch portion between the first display portion and the second display portion.

The first output wire may continuously extend between two opposing edges of the display area in the first region, the second output wire may not extend to the second display portion, and the third output wire may not extend to the first display portion.

A fourth output wire in the first region from among the plurality of output wires may be connected to the second driver, a fifth output wire at the first display portion from among the plurality of output wires may be connected to the third driver, and a sixth output wire at the second display portion from among the plurality of output wires may be connected to the fourth driver.

The fourth output wire may continuously extend between two opposing edges of the display area in the first region, and the fifth output wire and the sixth output wire may be connected to each other via a first connecting line positioned in the peripheral area between the first display portion and the second display portion.

Yet another embodiment of the present invention provides a display panel including: a first display area; a second display area and a third display area that are connected to the first display area in a first direction and that are spaced apart from each other in a second direction different from the first direction; a peripheral area around an entire display area that includes the first display area, the second display area, and the third display area; a first driver positioned at a first peripheral area of the peripheral area at a first side of the entire display area; and a plurality of signal lines connected to the first driver, wherein one of the plurality of signal lines may include a first portion at the second display area; a second portion at the third display area; and a third portion at a second peripheral area of the peripheral area between the second display area and the third display area, the third portion connecting the first portion and the second portion to each other.

The third portion may include a portion extending along a periphery of the second display area and the third display area.

According to the embodiments of the present invention, it is possible to reduce an area of a peripheral region in which a gate driver is positioned in a display panel including a notch portion of a shape in which some of one end of a substrate is eliminated.

BRIEF DESCRIPTION OF THE DRAWINGS

FIG. 20 illustrates a plane layout view of some of a display panel according to an exemplary embodiment.

DETAILED DESCRIPTION

Figure 1:
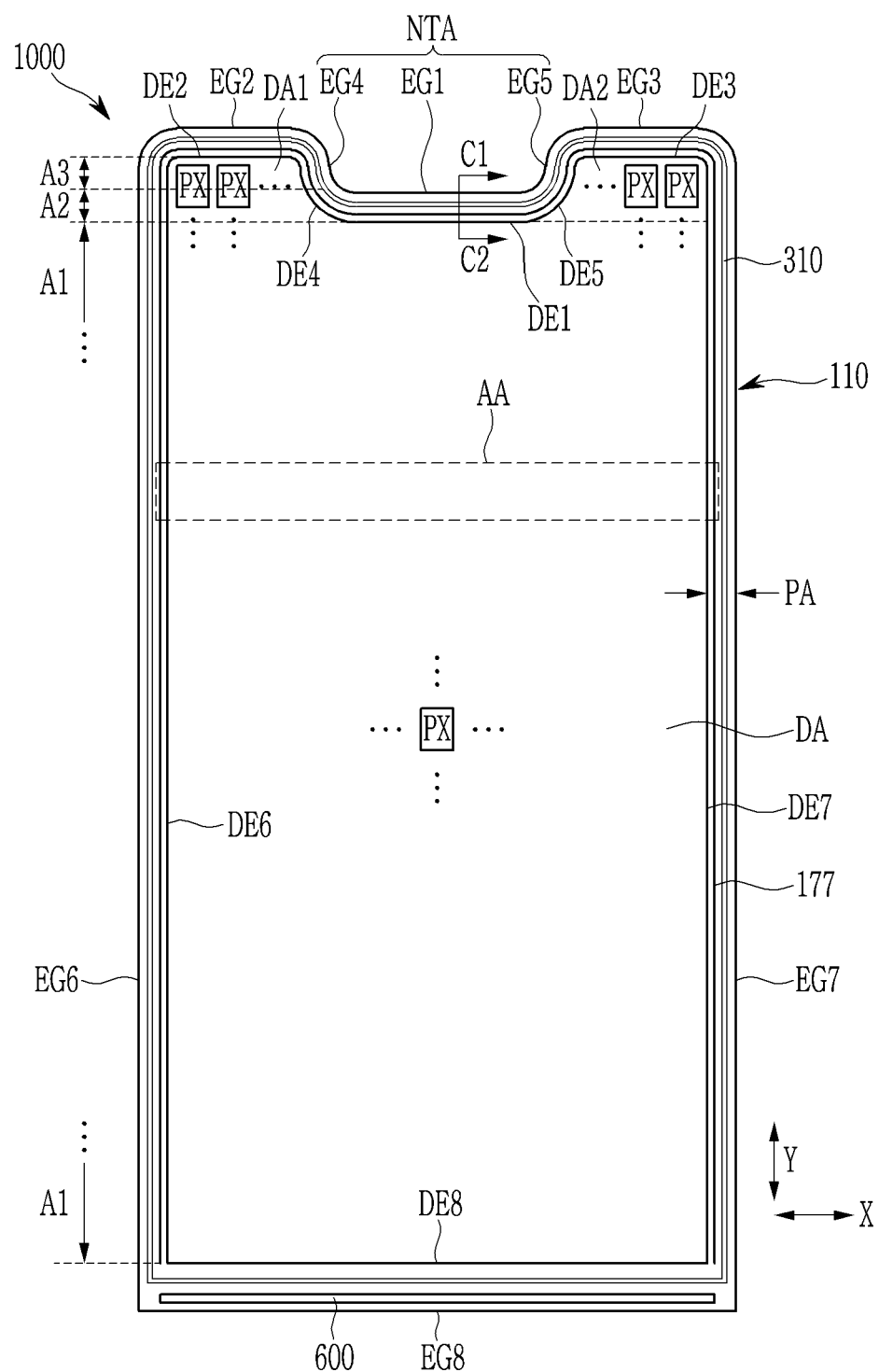
FIG. 1 illustrates a plan layout view of a display panel according to an embodiment.

Hereinafter, exemplary embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, a display panel according to exemplary embodiments will be described with reference to FIG. 1 to FIG. 7.

Referring to FIG. 1, a display panel 1000 according to an exemplary embodiment includes a substrate 110 including a display area DA as an area for displaying an image in a plan view and a peripheral area PA positioned outside the display area DA. In some embodiments, the peripheral area PA does not display an image, but in other embodiments it may include an area for displaying an image. In some embodiments, the term "in a plan view" means that a surface parallel to an X direction and a Y direction crossing each other is viewed, and the term "in a cross-sectional view" means that a surface cut in a perpendicular direction to a surface parallel to the X direction and the Y direction is viewed.

The substrate 110 may be a flexible substrate including plastic, a metal thin film, ultra-thin glass, or the like, or may be a substantially rigid substrate including glass or the like.

Referring to FIG. 1, the substrate 110 includes first to fifth edges EG1, EG2, EG3, EG4, and EG5 forming an upper edge, a sixth edge EG6 and a seventh edge EG7 forming left and right edges, and an eighth edge EG8 forming a lower edge. The first edge EG1 is positioned at a substantially central portion of the upper edge of the substrate 110 and is substantially parallel to the X direction, the second edge EG2 and the third edge EG3 are positioned at opposite sides with respect to the first edge EG1 and are substantially parallel to the X direction, the fourth edge EG4 connects the first edge EG1 and the second edge EG2, and the fifth edge EG5 connects the first edge EG1 and the third edge EG3. The fourth edge EG4 and the fifth edge EG5 extend in a direction crossing the X direction. The sixth edge EG6 and the seventh edge EG7 oppose each other and are substantially parallel to the Y direction, and the eighth edge EG8 opposes the upper edge of the substrate 110 and is substantially parallel to the X direction. A distance between the first edge EG1 and the eighth edge EG8 is smaller than that between both the second edge EG2 and the eighth edge EG8 and the third edge EG3 and the eighth edge EG8.

The first edge EG1, the fourth edge EG4, and the fifth edge EG5 form the upper edge of the substrate 110 and form a notch portion NTA having a shape in which a curved edge is formed and some of an upper end of the substrate 110 is eliminated. The fourth edge EG4 and the fifth edge EG5 may oppose each other with the notch portion NTA interposed therebetween. The substrate 110 may have a substantially left and right symmetrical shape with respect to a vertical bisector of the first edge EG1.

The display area DA may include a plurality of pixels PX and a plurality of signal lines, and displays an image on a surface parallel to the X direction and the Y direction.

Figure 2:
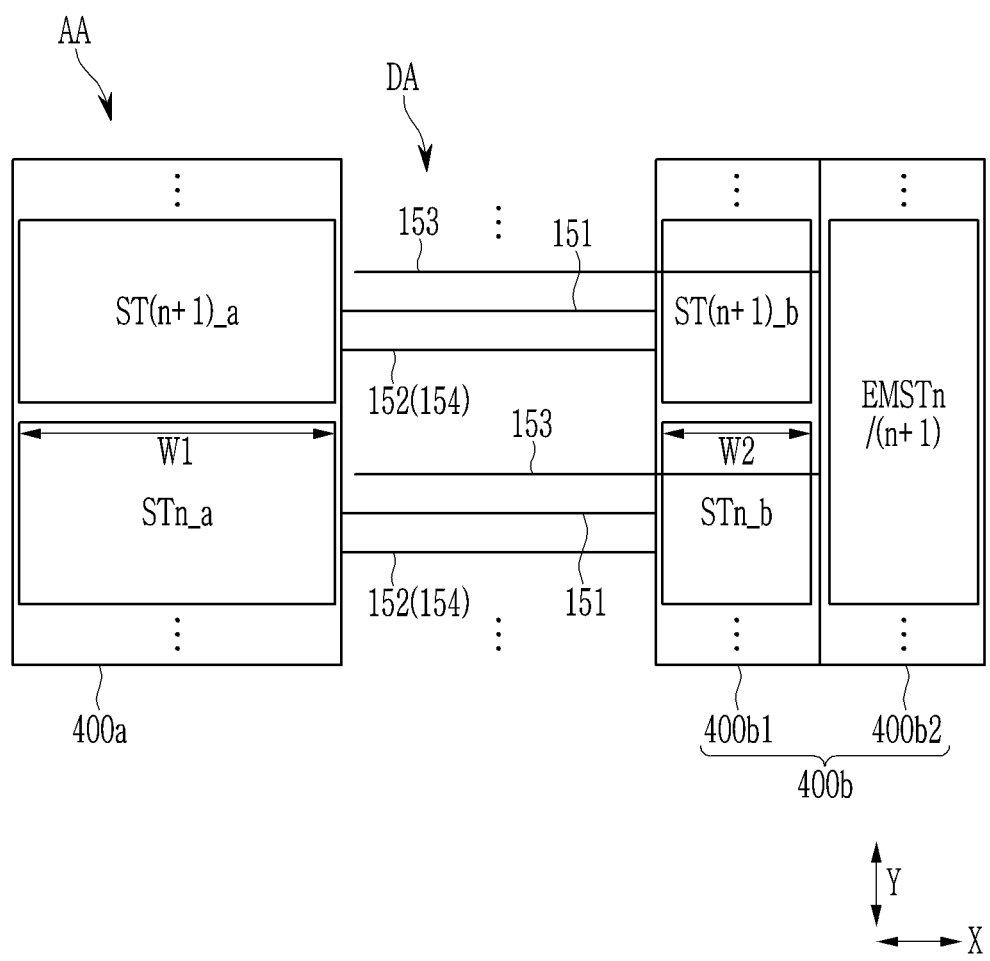
FIG. 2 illustrates a layout view of a portion of a region AA of the display panel shown in FIG. 1, FIG. 3 and FIG. 4 respectively illustrate plan layout views of a portion of a display panel according to an exemplary embodiment, FIG. 5 to FIG. 7 respectively illustrate plan layout views of a portion of a display panel according to an exemplary embodiment.

Referring to FIG. 2, in various embodiments, the signal lines include a plurality of scan lines 151, 152, and 154 and/or a plurality of control lines 153 as a plurality of output wires. Each output wire, that is, each of the scan lines 151, 152, and 154 and the control line 153 substantially extends in the X direction in the display area DA and extends to the peripheral area PA.

The pixel PX may include at least one switching element and a pixel electrode connected thereto. The switching element may be a three-terminal element such as a transistor and the like integrated in the display panel 1000. The switching element may be selectively turned on or turned off according to a gate signal transmitted by the scan lines 151, 152, and 154 or the control line 153. The pixel electrode may selectively receive a data signal via at least one switching element.

In order to display a color, each pixel PX may display one of predetermined colors, and an image of a desired color may be recognized as a sum of the images displayed by the predetermined colors. An example of the predetermined colors displayed by the plurality of pixels PX may be three primary colors of red, green, and blue, or three primary colors of yellow, cyan, and magenta, and at least one different color such as white may be further included as well as the three primary colors.

Referring to FIG. 1, in the display area DA, an area between an edge DE1 of the display area DA extending to be parallel to the first edge EG1 and an extension line of the edge DE1, and an edge DE8 of the display area DA extending to be parallel to the eighth edge EG8 is referred to as a first area A1; an area between the edge DE1 of the display area DA and an extension line of the edge DE1, and the first edge EG1 of the substrate 110 and an extension line of the first edge EG1 is referred to as a second area A2; and an area is referred to as a third area A3 between the edges DE2 and DE3 of the display area DA extending to be parallel to the second edge EG2 and the third edge EG3, and the first edge EG1 of the substrate 110 and an extension line of the first edge EG1.

As described above, because the substrate 110 includes the notch portion NTA, the display area DA, as shown in FIG. 1, may be positioned with the notch portion NTA interposed therebetween, and may include a first display portion (or, first display area) DA1 and a second display portion (or, second display area) DA2. The first display portion DA1 and the second display portion DA2 are included in the second area A2 and the third area A3 in the display area DA, and a display area capable of displaying an image may not be positioned between the first display portion DA1 and the second display portion DA2, but the notch portion NTA in which some of an upper end of the substrate 110 is removed may be positioned between the first display portion DA1 and the second display portion DA2.

The peripheral area PA is positioned around the outside of the display area DA. Referring to FIG. 1 to FIG. 4, the peripheral area PA may include a pad region 600, a seal 310, gate drivers 400*a* and 400*b*, and a voltage transmitting line 177.

The pad region 600 may be positioned in the peripheral area PA that is positioned at one side of the display area DA, and may include a plurality of pads capable of connecting an IC chip, a circuit film, and the like. For example, the pad region 600 may be positioned in the peripheral area PA between the edge DE8 of the display area DA parallel to the eighth edge EG8 of the substrate 110 and the eighth edge EG8.

The seal 310 may be continuously formed along the edge of the substrate 110 in a plan view to form a closed curve. For a process margin, the seal 310 may be spaced apart from the edge of the substrate 110 at a predetermined distance. The seal 310 is positioned on the substrate 110, and although not shown in FIG. 1 to FIG. 7, the seal 310 may be positioned between the substrate 110 and another substrate opposing the substrate 110 to attach the two substrates to each other and to seal between the two substrates. A material of the seal 310 may include a frit having excellent moisture resistance, and may include an organic sealant and a hygroscopic material. The material of the seal 310 may further include a light absorbing material capable of absorbing a laser, an infrared ray, or the like. The material of the seal 310 is positioned between the two substrates, and is melted when heat is applied thereto, so that the substrate 110 and another substrate opposing the substrate 110 may be attached to each other.

According to another embodiment, the seal 310 may be omitted according to a structure of the display panel, and in this case, the display panel may include a separate seal for protecting electrical elements formed on the substrate 110 from external impurities. For example, the separate seal may include thin films such as an organic insulating film and an inorganic insulating film alternately stacked on the electrical elements formed on the substrate 110.

The gate drivers 400*a* and 400*b* may be connected to the plurality of output wires, that is, the plurality of scan lines 151, 152, and 154 and the plurality of control lines 153 to apply gate signals.

Figure 3:
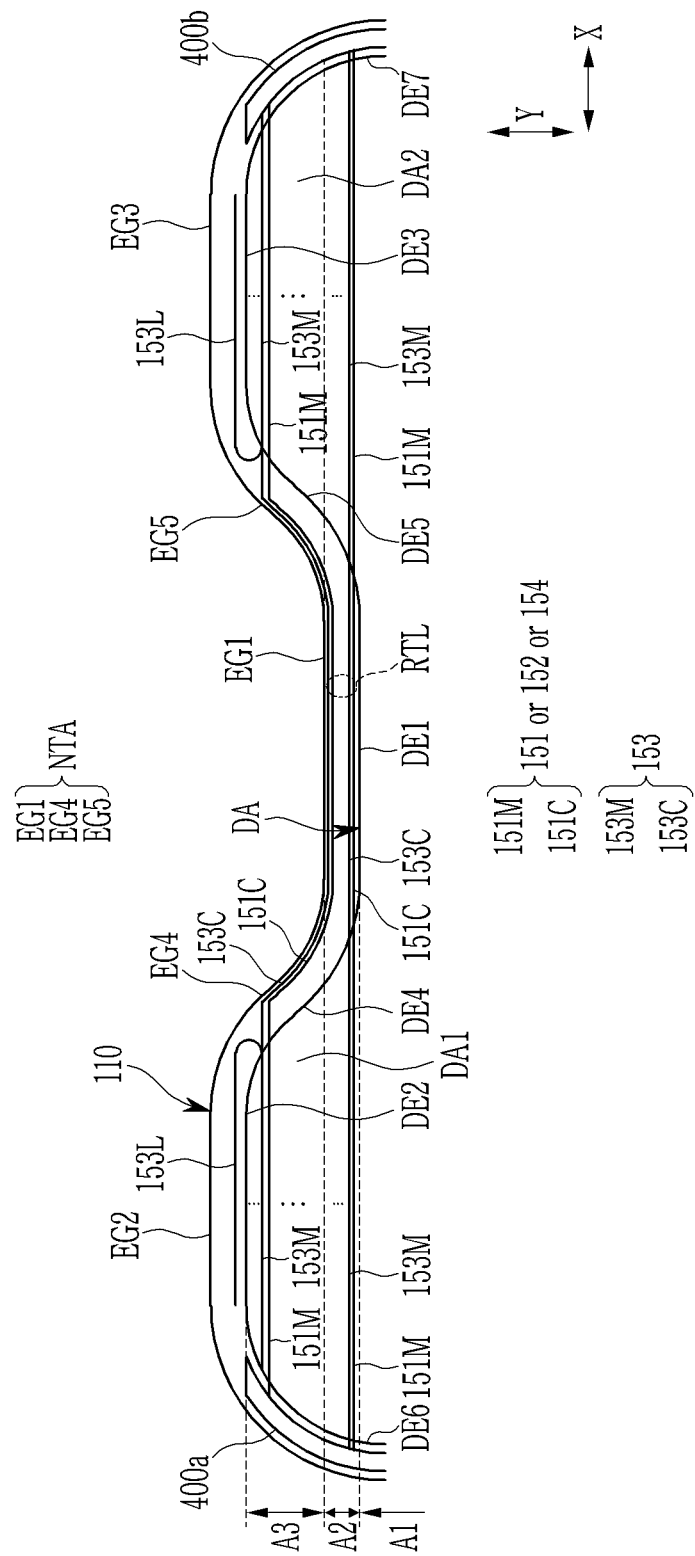

Referring to FIG. 2 and FIG. 3, the gate driver 400*a* may be positioned at a first side (e.g., left side) with respect to the display area DA, and the gate driver 400*b* may be positioned at a second side (e.g., right side) opposite to the first side. In various embodiments, the gate driver 400*a* is formed along the peripheral area PA adjacent to the edge DE6 of the display area DA parallel to the sixth edge EG6 of the substrate 110, and the gate driver 400*b* is formed along the peripheral area PA adjacent to the edge DE7 of the display area DA parallel to the seventh edge EG7 of the substrate 110. In other embodiments, the left and right positions of the gate driver 400*a* and the gate driver 400*b* may be exchanged with each other.

Each of the gate drivers 400*a* and 400*b* may be continuously formed over the first area A1, the second area A2, and the third area A3. Each of the gate drivers 400*a* and 400*b* may be positioned in the peripheral area PA between the seal 310 and the display area DA, but is not limited thereto, and it may overlap at least some of a region in which the seal 310 is formed.

Referring to FIG. 2, a structure of the gate driver 400*a* is different from that of the gate driver 400*b*, so the two gate drivers 400*a* and 400*b* may have an asymmetric structure with respect to each other. Herein, a symmetrical or asymmetrical reference may mean to be symmetrical or asymmetrical with respect to a central vertical line of the display panel 1000, which is the same hereafter.

The gate driver 400*a* may include a plurality of stages ( . . . , STn_a, ST(n+1)_a, . . . ) (n is a natural number of 1 or more) that are sequentially arranged in the peripheral area PA of the first to third areas A1, A2, and A3. Circuit structures of respective stages ( . . . , STn_a, ST(n+1)_a, . . . ) may be substantially the same.

The gate driver 400*b* may include a first sub-driver 400*b*1 and a second sub-driver 400*b*2. Like the gate driver 400*a*, the first sub-driver 400*b*1 may include a plurality of stages ( . . . , STn_b, ST(n+1)_b, . . . ) that are sequentially arranged in the peripheral area PA of the first to third areas A1, A2, and A3. The second sub-driver 400*b*2 may include a plurality of stages ( . . . , EMSTn/(n+1), . . . ) that are sequentially arranged in the peripheral area PA of the first to third areas A1, A2, and A3. The first sub-driver 400*b*1 may be positioned between the second sub-driver 400*b*2 and the display area DA, but is not limited thereto, and the left and right positions of the first sub-driver 400*b*1 and the second sub-driver 400*b*2 may be changed.

The plurality of stages ( . . . , STn_a, ST(n+1)_a, . . . ) of the gate driver 400*a* and the plurality of stages ( . . . , STn_b, ST(n+1)_b, . . . ) of the first sub-driver 400*b*1 of the gate driver 400*b* may oppose and correspond to each other. Accordingly, a width of the Y direction of one stages ( . . . , STn_a, ST(n+1)_a, . . . ) may be substantially the same as that of the Y direction of one of the stages ( . . . , STn_b, ST(n+1)_b, . . . ). However, a width W1 of the X direction of the stages ( . . . , STn_a, ST(n+1)_a, . . . ) of the gate driver 400*a* may be greater than a width W2 of the X direction of the stages ( . . . , STn_b, ST(n+1)_b, . . . ) of the first sub-driver 400*b*1 of the gate driver 400*b*. A circuit structure of each stage ( . . . , STn_b, ST(n+1)_b, . . . ) of the first sub-driver 400*b*1 of the gate driver 400*b* may be substantially the same as that of each stage ( . . . , STn_a, ST(n+1)_a, . . . ) of the gate driver 400*a*, but an area of the circuit structure of each stage ( . . . , STn_b, ST(n+1)_b, . . . ) of the first sub-driver 400*b*1 of the gate driver 400*b* may be different from that of the circuit structure of each stage ( . . . , STn_a, ST(n+1)_a, . . . ) of the gate driver 400*a*.

The plurality of scan lines 151, 152, and 154 positioned in the display area DA may be connected to the gate driver 400*a* and the first sub-driver 400*b*1 of the gate driver 400*b* to receive the gate signal. Particularly, the stages ( . . . , STn_a, ST(n+1)_a, . . . ) and the stages ( . . . , STn_b, ST(n+1)_b, . . . ) of the gate driver 400*a* and the first sub-driver 400*b*1 corresponding to each other may output the same gate signal. However, the first sub-driver 400*b*1 is provided to complement the gate driver 400*a*, and the plurality of scan lines 151, 152, and 154 may mainly receive the gate signal from the gate driver 400*a*. The first sub-driver 400*b*1 of the gate driver 400*b* may be omitted. That is, the gate driver 400*b* may include only the second sub-driver 400*b*2 connected to the control line 153.

The control line 153 positioned in the display area DA may be connected to the second sub-driver 400*b*2 of the gate driver 400*b* to receive the control signal. According to a circuit structure of the pixel PX of the display area DA, the control line 153 may be omitted, and in this case, the second sub-driver 400*b*2 of the gate driver 400*b* may also be omitted.

As such, the gate driver 400*a* and the gate driver 400*b* positioned in the peripheral areas PA at opposite sides with respect to the display area DA are formed to not be the same but to be asymmetrical with each other, and they may be configured as a minimum required to drive, thus the areas of the peripheral areas PA positioned on the left and right may be further reduced. For example, the gate driver 400*a*, which is a main driver for the scan lines 151, 152, and 154, is disposed in an area of the peripheral areas PA with respect to the display area DA, and the second sub-driver 400*b*2 of the gate driver 400*b*, which is a driver for the control line 153, is disposed in an area of the peripheral area PA at an opposite side to the gate driver 400*a* with respect to the display area DA, thus a driving signal may be applied to the scan lines 151, 152 and 154 and the control line 153 in an entire area of the display area DA. In addition, the left and right peripheral areas PA, that is, an area of a bezel, may be further reduced by making a size of the first sub-driver 400*b*1 smaller than that of the gate driver 400*a*.

The gate drivers 400*a* and 400*b* may be directly formed on the substrate 110 together with the plurality of signal lines and switching elements positioned in the display area DA.

The voltage transmitting line 177 extends along at least three edges of the left and right edges DE6 and DE7 of the display area DA and the upper edges DE1, DE2, DE3, DE4, and DE5 thereof, and may transmit a constant voltage such as a common voltage ELVSS. Although not shown, some of the voltage transmitting lines 177 extending along the upper edges DE1, DE2, DE3, DE4, and DE5 of the display area DA may have a thickness to be thinner than the remainder thereof, or may be omitted. The voltage transmitting line 177 may be positioned between the seal 310 and the gate drivers 400*a* and 400*b*, but is not limited thereto, and it may overlap at least some of the seal 310.

Referring to FIG. 2 and FIG. 3, in the first area A1, the output wires, that is, the scan lines 151, 152, and 154 and/or the control line 153 may be connected to the plurality of pixels PX in the display area DA, and may continuously extend from the left edge DE6 to the right edge DE7 of the display area DA. In contrast, in the second area A2 and the third area A3, because the display area DA is divided into the first display portion DA1 and the second display portion DA2 which are separated by the notch portion NTA, the output wires, that is, the scan lines 151, 152, and 154 and/or the control line 153, cannot continuously extend throughout the second area A2 and the third area A3 of the display area DA.

Referring to FIG. 3, in the second area A2 and the third area A3, at least one of the output wires, that is, of the scan lines 151, 152, and 154 and the control line 153, is positioned in the display area DA (i.e., the first display portion DA1 and the second display portion DA2), and may include main lines 151M and 153M connected to the pixel PX and connecting lines 151C and 153C positioned in the peripheral area PA between the first edge EG1 of the substrate 110 and the edge DE1 of the display area DA. The connecting lines 151C and 153C are positioned between the two main lines 151M and 153M which are respectively positioned at the first and second display portions DA1 and DA2, and may be connected to the two main lines 151M and 153M. The connecting lines 151C and 153C may extend between the edge DE4 of the display area DA parallel to the fourth edge EG4 of the substrate 110 and the edge DE5 of the display area DA parallel to the fifth edge EG5 of the substrate 110.

The output wires, that is, the scan lines 151, 152, and 154 and/or the control line 153, positioned at the first display portion DA1 and the second display portion DA2, mainly extend in the X direction, thus, because their extension direction crosses the fourth edge EG4 and the fifth edge EG5 of the substrate 110, the scan lines 151, 152, and 154 and/or the control line 153 positioned at the first and second display portions DA1 and DA2, as in the first area A1, may be continuously connected in the X direction. However, according to the present exemplary embodiment, the main lines 151M and 153M respectively positioned at the first and second display portions DA1 and DA2 positioned at the opposite sides with respect to the notch portion NTA of the substrate 110 are connected as one wire via the connecting lines 151C and 153C, so the gate signal outputted from the gate driver 400*a* positioned at one peripheral area PA may be equally transmitted to the main lines 151M and 153M which are respectively positioned at the first and second display portions DA1 and DA2. That is, in the display panel 1000 including the notch portion NTA, even if the gate drivers 400*a* and 400*b* positioned at the opposite sides of the display area DA are not symmetrically formed, the driving signal may be transmitted to all of the scan lines 151, 152, and 154 and/or the control line 153 which are respectively positioned at the first and second display portions DA1 and DA2, and, as further described above, it may be possible to reduce the peripheral area PA in which the gate drivers 400*a* and 400*b* is positioned, that is, a size of a bezel.

The main lines 151M and 153M may substantially extend to be parallel to the X direction. Most of the connecting lines 151C and 153C positioned in the second area A2 may be substantially parallel to the X direction. However, in the third area A3, because the substrate 110 is not present between the first and second display portions DA1 and DA2, the connecting lines 151C and 153C are bent before meeting the fourth edge EG4 and the fifth edge EG5 of the substrate 110, thus they may include a portion extending in parallel along the fourth edge EG4, the fifth edge EG5, and the first edge EG1 of the substrate 110, that is, the notch portion NTA.

The main lines 151M and 153M positioned at the first and second display portions DA1 and DA2 and the connecting lines 151C and 153C connected thereto are referred to as a connecting line unit (RTL). As described above, the connecting line unit (RTL) is positioned in the peripheral area PA (i.e., the peripheral area PA between the first display portion DA1 and the second display portion DA2) between the three edges EG1, EG4, and EG5 of the substrate 110 and the display area DA which form the notch portion NTA, and it may substantially extend to be parallel to the three edges EG1, EG4, and EG5. In the exemplary embodiment shown in FIG. 3, the connecting line unit (RTL), like the connecting lines 151C and 153C connected to the main lines 151M and 153M positioned in the third area A3, may include a connecting line bent at least once in the peripheral area PA, and, like the connecting lines 151C and 153C connected to the main lines 151M and 153M positioned in the second area A2, may include a connecting line that is not substantially bent in the peripheral area PA and extends in a straight line from the main lines 151M and 153M.

Referring to FIG. 3, the control line 153 positioned in the third area A3 may be connected to a dummy line 153L near the edges DE4 and DE5 of the display area DA. The dummy line 153L may be positioned in the peripheral area PA, may be bent at least once, and may extend to be parallel to the control line 153 connected thereto. The dummy line 153L is for providing load uniformity of the control line 153. Because the number of pixels PX connected to the control line 153 in the third area A3 is smaller than the number of pixels PX connected to the control line 153 in the first area A1 or the second area A2, a load of signals transmitted by the control line 153 positioned in the third area A3 may be smaller than that transmitted by the control line 153 positioned in the first area A1 or the second area A2. However, according to the present exemplary embodiment, because the control line 153 positioned in the third area A3 is additionally connected to the dummy line 153L, the control line 153 is lengthened, thus load deviation according to the position of the control line 153 may be compensated.

Figure 4:
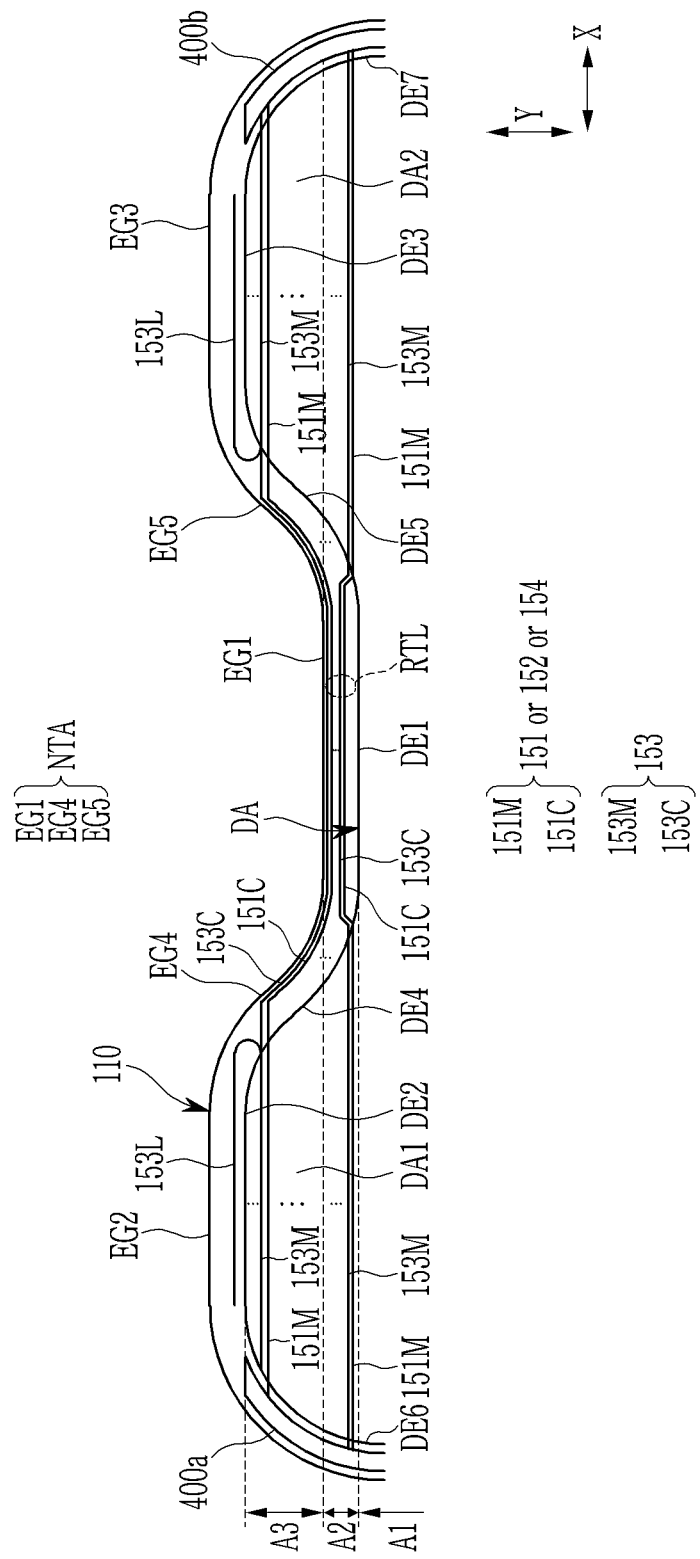

The exemplary embodiment shown in FIG. 4 is mostly the same as the exemplary embodiment shown in FIG. 3, but the connecting lines 151C and 153C connected to the main lines 151M and 153M positioned in the second area A2, like the connecting lines 151C and 153C connected to the main lines 151M and 153M positioned in the third area A3, may include a portion extending in parallel along the fourth edge EG4, the fifth edge EG5, and the first edge EG1 of the substrate 110. That is, the connecting lines 151C and 153C connected to the main lines 151M and 153M positioned in the second area A2 may be bent near the edges DE4 and DE5 of the display area DA, and may extend in parallel to be adjacent to the connecting lines 151C and 153C connected to the main lines 151M and 153M of the third area A3. In the exemplary embodiment shown in FIG. 4, most of the connecting lines 151C and 153C included in the connecting line unit (RTL) may be bent at least once in the peripheral area PA, may be joined to be adjacent to each other, and then may extend in parallel with each other.

As such, in each of the second area A2 and the third area A3, when the connecting lines 151C and 153C are disposed to extend in parallel to be adjacent to each other, it is possible to further secure uniformity of characteristics of the output wires positioned in the second area A2 and the third area A3, that is, of the scan lines 151, 152, and 154 and the control line 153.

Figure 5:
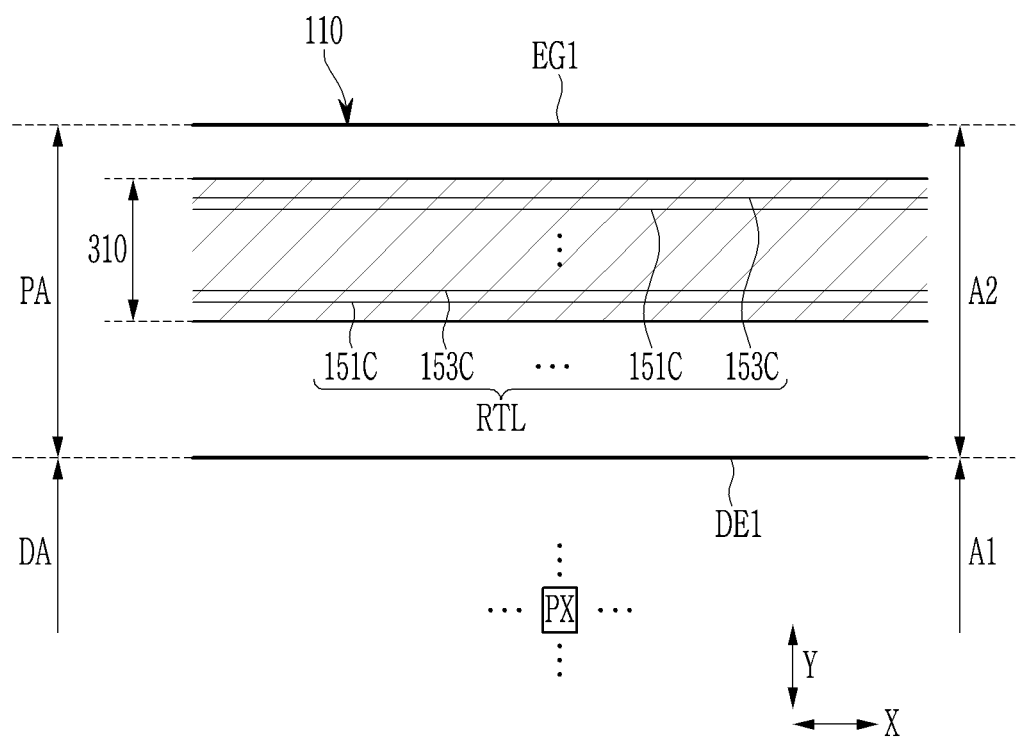
Figure 6:
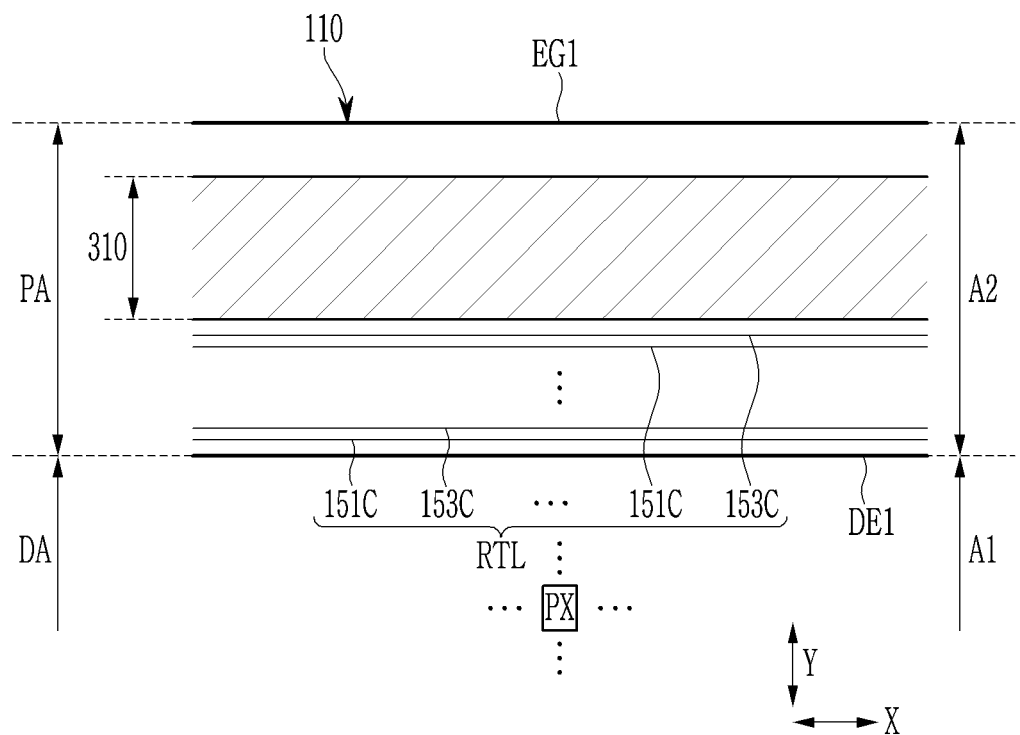
Figure 7:
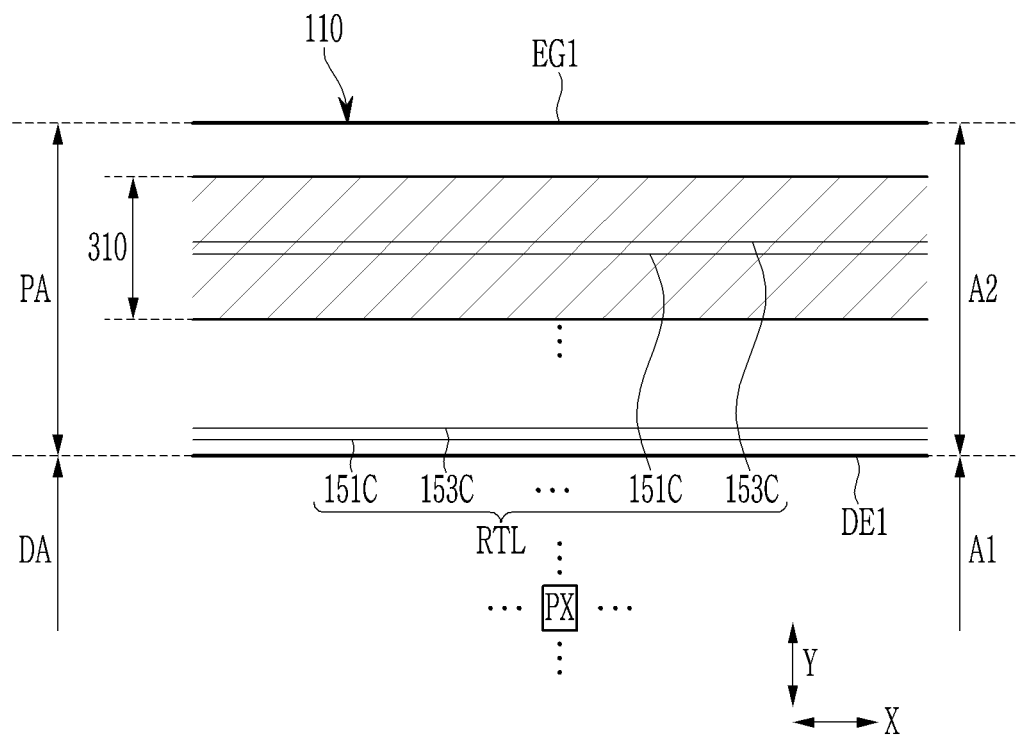

Referring to FIG. 5 to FIG. 7 together with FIG. 4, a region in which the connecting lines 151C and 153C included in the connecting line unit (RTL) are positioned may be various. For example, FIG. 5 shows an example in which the connecting line unit (RTL) overlaps a region in which the seal 310 is positioned to be positioned inside a region in which the seal 310 is positioned, and FIG. 6 shows an example in which the connecting line unit (RTL) is positioned in the peripheral area PA between the seal 310 and the display area DA. In the exemplary embodiment shown in FIG. 5 and FIG. 6, the connecting lines 151C and 153C included in the connecting line unit (RTL) are positioned in the same area, thus they may have the same characteristic (e.g., load).

FIG. 7 shows an example in which the connecting line unit (RTL) is positioned over a region in which the seal 310 is positioned and the peripheral area PA between the seal 310 and the display area DA. This may correspond to a case in which the display panel 1000 has high resolution, or in which all of the connecting line unit (RTL) is not positioned in one area because the number of the pixels PX positioned at the first display portion DA1 and the second display portion DA2 separated with respect to the notch portion NTA is large and thus the number of the connecting lines 151C and 153C is large.

Now, referring to FIG. 8 to FIG. 10 together with the above-described drawings, a structure of a pixel PX of a display panel according to an exemplary embodiment will be described.

Figure 8:
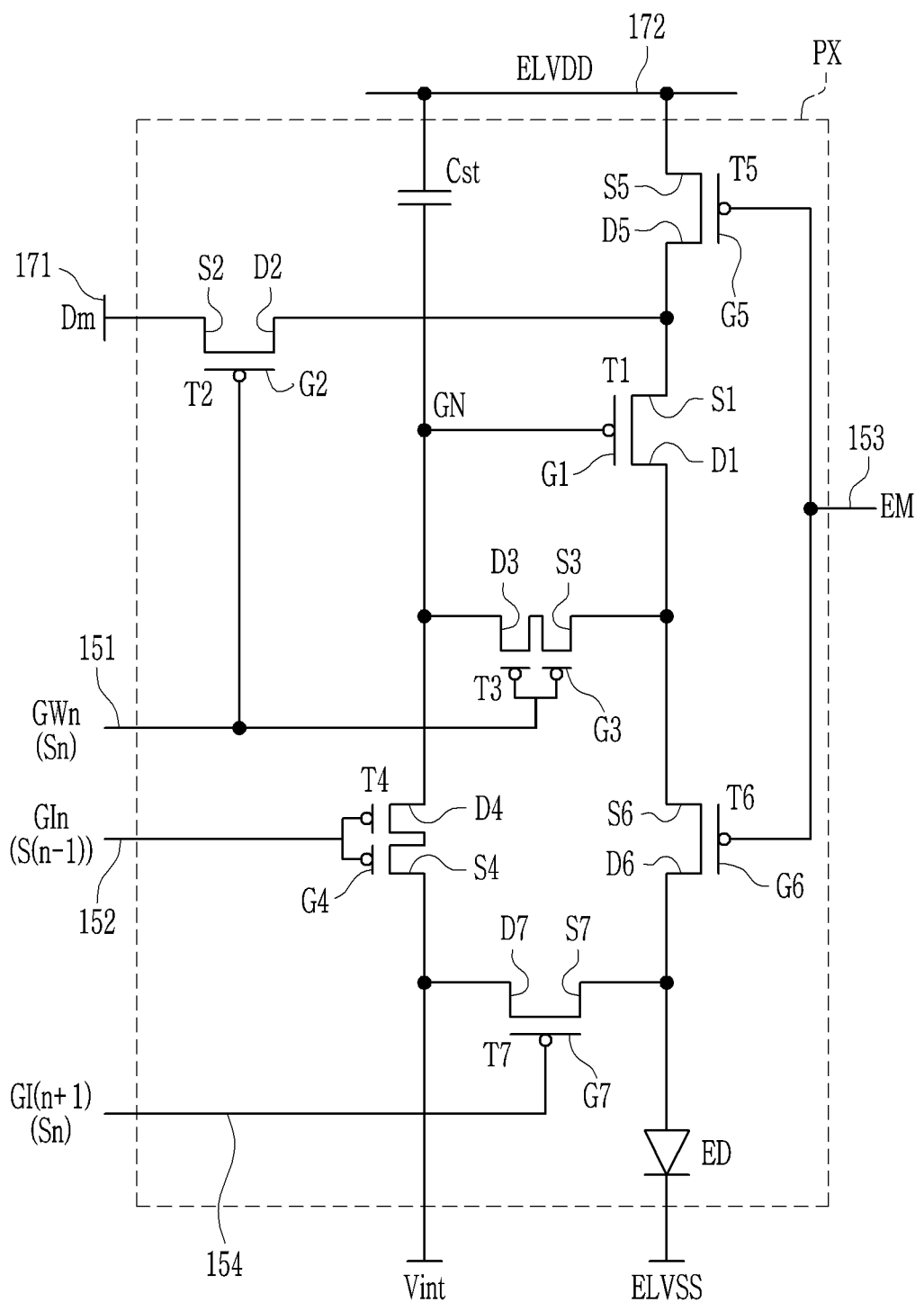
FIG. 8 illustrates an equivalent circuit diagram of a pixel of a display panel according to an exemplary embodiment.
Figure 9:
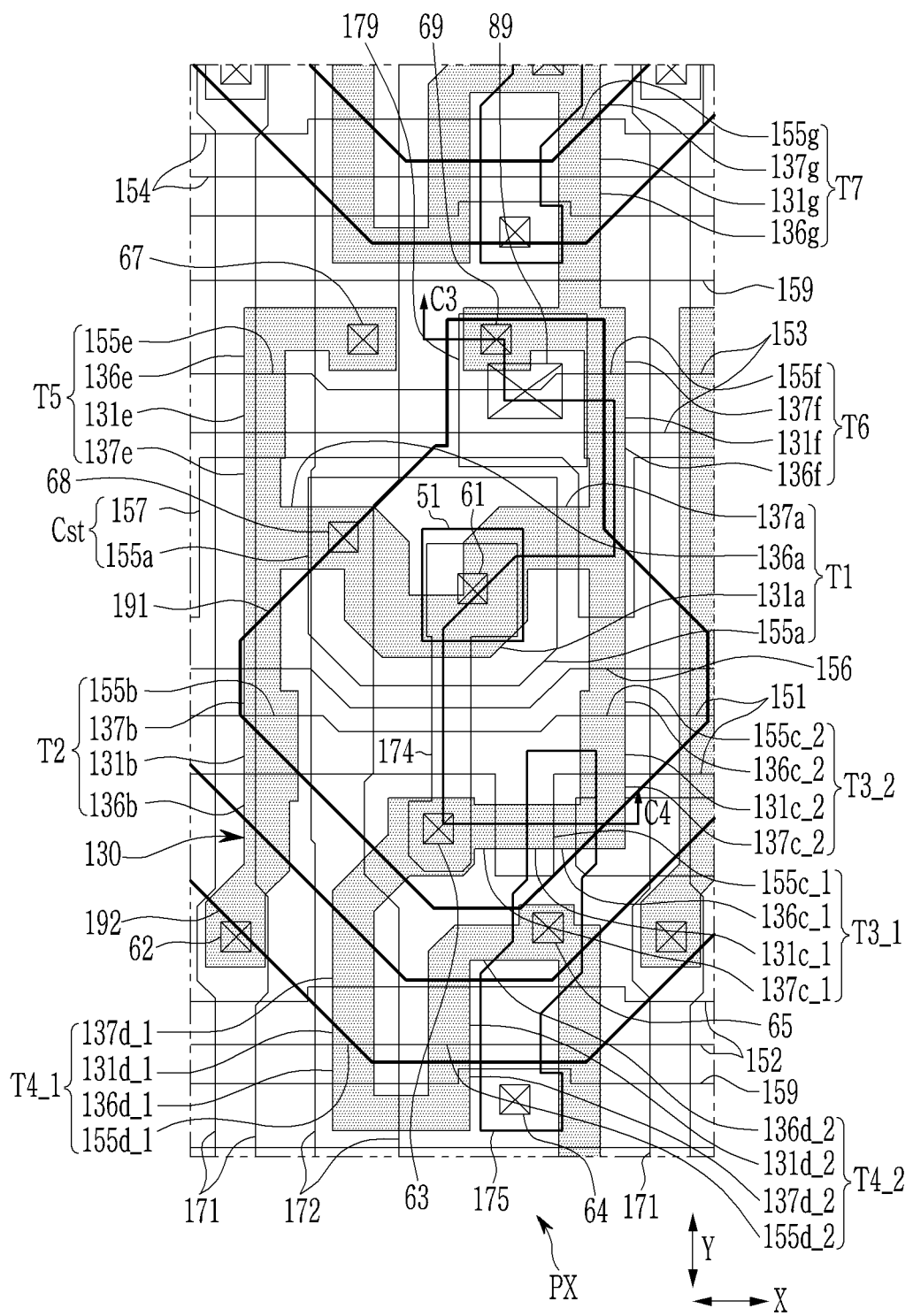
FIG. 9 illustrates a plan layout view of a pixel of a display panel according to an exemplary embodiment.

Referring to FIG. 8, a pixel PX of a display panel according to an exemplary embodiment may include a plurality of transistors T1, T2, T3, T4, T5, T6, and T7 connected to a plurality of signal lines 151, 152, 153, 154, 171, and 172, a capacitor Cst, and at least one light emitting diode (ED). The signal lines 151, 152, 153, 154, 171, and 172 may include the plurality of scan lines 151, 152, and 154, the control line 153, a data line 171, and a driving voltage line 172.

Each of the scan lines 151, 152, and 154 may transmit scan signals GWn, GIn, and GI(n+1). The scan signals GWn, GIn, and GI(n+1) may be a gate-on voltage and a gate-off voltage capable of turning-on/turning-off the transistors T2, T3, T4, and T7 included in the pixel PX. The scan lines 151, 152, and 154 connected to one pixel PX may include a first scan line 151 capable of transmitting the scan signal GWn, a second scan line 152 capable of transmitting the scan signal GIn having the gate-on voltage at a different time from that of the first scan line 151, and a third scan line 154 capable of transmitting a scan signal GI(n+1). In the present exemplary embodiment, an example in which the second scan line 152 transmits the gate-on voltage at the earlier time than that of the first scan line 151 is mainly described. For example, when the scan signal GWn is an n-th scan signal Sn among the scan signals applied during one frame (n is a natural number of 1 or more), the scan signal Gln may be a previous scan signal such as an (n−1)-th scan signal S(n−1), and the scan signal GI(n+1) may be an n-th scan signal Sn. However, the present exemplary embodiment is not limited thereto, and the scan signal GI(n+1) may be a different scan signal from the n-th scan signal Sn.

The control line 153 may transmit a control signal, and particularly, may transmit an emission control signal capable of controlling the emission of the light emitting diode ED included in the pixel PX. The control signal transmitted by the control line 153 may transmit the gate-on voltage and the gate-off voltage, and may have a different waveform from that of the scan signal transmitted by the scan lines 151, 152, and 154.

The data line 171 may transmit a data signal Dm, and the driving voltage line 172 may transmit a driving voltage ELVDD. The data signal Dm may have other voltage levels according to the image signal inputted to the display device, and the driving voltage ELVDD may substantially have a constant level.

The plurality of transistors T1, T2, T3, T4, T5, T6, and T7 included in one pixel PX may include a first transistor T1, a second transistor T2, a third transistor T3, a fourth transistor T4, a fifth transistor T5, a sixth transistor T6, and a seventh transistor T7.

The first scan line 151 may transmit the scan signal GWn to the second transistor T2 and the third transistor T3, the second scan line 152 may transmit the scan signal Gln to the fourth transistor T4, the third scan line 154 may transmit the scan signal GI(n+1) to the seventh transistor T7, and the control line 153 may transmit the control signal EM to the fifth transistor T5 and the sixth transistor T6.

A gate electrode G1 of the first transistor T1 is connected to one terminal Cst1 of the capacitor Cst via a driving gate node GN, a source electrode S1 of the first transistor T1 is connected to the driving voltage line 172 via the fifth transistor T5, and a drain electrode D1 of the first transistor T1 is connected to an anode of the light emitting diode ED via the sixth transistor T6. The first transistor T1 receives the data signal Dm transmitted by the data line 171 depending on a switching operation of the second transistor T2 to supply a driving current Id to the light emitting diode ED.

A gate electrode G2 of the second transistor T2 is connected to the first scan line 151, a source electrode S2 of the second transistor T2 is connected to the data line 171, and a drain electrode D2 of the second transistor T2 is connected to the driving voltage line 172 via the fifth transistor T5 while being connected to the source electrode S1 of the first transistor T1. The second transistor T2 is turned on depending on the scan signal GWn transmitted via the first scan line 151 such that the data signal Dm transmitted from the data line 171 may be transmitted to the source electrode S1 of the first transistor T1.

A gate electrode G3 of the third transistor T3 is connected to the first scan line 151, and a source electrode S3 of the third transistor T3 is connected to the anode of the light emitting diode (LED) ED via the sixth transistor T6 while being connected to the drain electrode D1 of the first transistor T1. A drain electrode D3 of the third transistor T3 is connected to a drain electrode D4 of the fourth transistor T4, one terminal Cst1 of the capacitor Cst, and the gate electrode G1 of the first transistor T1. The third transistor T3 is turned on depending on the scan signal GWn transmitted via the first scan line 151 to diode-connect the first transistor T1 by connecting the gate electrode G1 and the drain electrode D1 of the first transistor T1 to each other.

A gate electrode G4 of the fourth transistor T4 is connected to the second scan line 152, a source electrode S4 of the fourth transistor T4 is connected to an initialization voltage Vint, and a drain electrode D4 of the fourth transistor T4 is connected to one terminal Cst1 of the capacitor Cst and the gate electrode G1 of the first transistor T1 via the drain electrode D3 of the third transistor T3. The fourth transistor T4 is turned on depending on the scan signal Gln transmitted via the second scan line 152 to transmit the initialization voltage Vint to the gate electrode G1 of the first transistor T1, thereby performing an initialization operation of initializing the voltage of the gate electrode G1 of the first transistor T1.

A gate electrode G5 of the fifth transistor T5 is connected to the control line 153, a source electrode S5 of the fifth transistor T5 is connected to the driving voltage line 172, and a drain electrode D5 of the fifth transistor T5 is connected to the source electrode S1 of the first transistor T1 and the drain electrode D2 of the second transistor T2.

A gate electrode G6 of the sixth transistor T6 is connected to the control line 153, a source electrode S6 of the sixth transistor T6 is connected to the drain electrode D1 of the first transistor T1 and the source electrode S3 of the third transistor T3, and a drain electrode D6 of the sixth transistor T6 is electrically connected to the anode of the light emitting diode ED. The fifth transistor T5 and the sixth transistor T6 are concurrently (e.g. simultaneously) turned on depending on the emission control signal EM transmitted via the control line 153, thereby the driving voltage ELVDD is compensated via the diode-connected first transistor T1 to be transmitted to the light emitting diode ED.

A gate electrode G7 of the seventh transistor T7 is connected to the third scan line 154, a source electrode S7 of the seventh transistor T7 is connected to the drain electrode D6 of the sixth transistor T6 and the anode of the light emitting diode ED, and a drain electrode D7 of the seventh transistor T7 is connected to the terminal of the initialization voltage Vint and the source electrode S4 of the fourth transistor T4.

One terminal Cst1 of the capacitor Cst is connected to the gate electrode G1 of the first transistor T1 as described above, and the other terminal Cst2 thereof is connected to the driving voltage line 172. A cathode of the light emitting diode ED may be connected to the terminal of the common voltage ELVSS transmitting the common voltage ELVSS to receive the common voltage ELVSS.

The structure of the pixel PX according to an exemplary embodiment is not limited to the structure shown in FIG. 1, and a number of transistors and a number of capacitors that are included in one pixel PX and a connection relationship thereof may be variously modified.

Hereinafter, referring to FIG. 9 and FIG. 10 together with FIG. 8, a specific structure of a pixel PX of a display panel according to an exemplary embodiment will be described.

Figure 10:
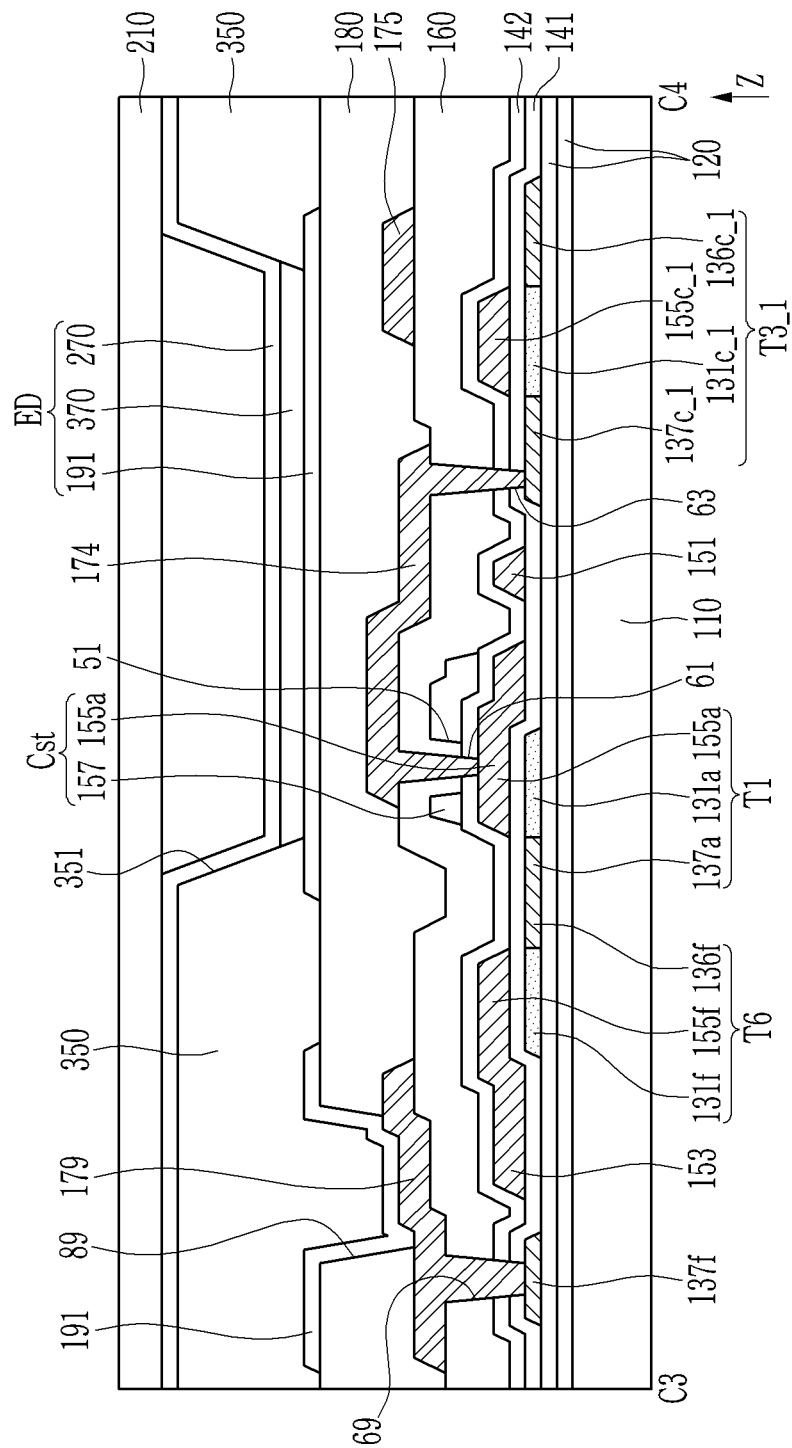
FIG. 10 illustrates a cross-sectional view taken along line C3-C4 of the display panel according to the exemplary embodiment shown in FIG. 9, FIG. 11 to FIG. 18 respectively illustrate cross-sectional views taken along line C1-C2 of the display panel according to the exemplary embodiment shown in FIG. 1.

Referring to FIG. 10, a barrier layer 120 including a plurality of layers or a single layer may be positioned on the substrate 110. An active pattern 130 is positioned on the barrier layer 120. The active pattern 130 may include a plurality of source regions (136a, 136b, 136c1, 136c_2, 136d_1, 136d_2, 136e, 136f, and 136g), a plurality of drain regions (137a, 137b, 137c_1, 137c_2, 137d_1, 137d_2, 137e, 137f, and 137g), and a plurality of channel regions (131a, 131b, 131c_1, 131c_2, 131d_1, 131d_2, 131e, 131f, and 131g) positioned between the source regions and the drain regions opposing each other. The source regions (136a, 136b, 136c_1, 136c_2, 136d_1, 136d_2, 136e, 136f, and 136g) and the drain regions (137a, 137b, 137c_1, 137c_2, 137d_1, 137d_2, 137e, 137f, and 137g) are conductive regions. The active pattern 130 of one pixel PX may be formed as a single continuous pattern. The active pattern 130 may include amorphous silicon, polysilicon, or an oxide semiconductor.

A first insulating layer 141 may be positioned on the active patterns 130, and a first conductive layer may be positioned on the first insulating layer 141. The first conductive layer may include the plurality of scan lines 151, 152, and 154 and the control line 153 which are described above, and a driving gate electrode 155a. The third scan line 154 is a scan line of the same kind as the second scan line 152, and may transmit the scan signal GI(n+1) at a next stage of the scan signal Gln transmitted by the second scan line 152. When the scan signals are inputted in order from a bottom to a top in the display panel 1000 shown in FIG. 1, the display panel 1000 may have a structure in which the second scan line 152, the first scan line 151, and the control line 153 are alternately arranged in the Y direction from the bottom to the top.

The active pattern 130, and the plurality of scan lines 151, 152, and 154 and the control line 153 that overlap the active pattern 130 may form a plurality of transistors (T1, T2, T3_1, T3_2, T4_1, T4_2, T5, T6, and T7). The first transistor T1 includes the driving gate electrode 155a that overlaps the channel region 131a, the source region 136a, the drain region 137a, and the channel region 131a in a plan view. The second transistor T2 includes the channel region 131b, the source region 136b, the drain region 137b, and a gate electrode 155b which is a portion of the first scan line 151 overlapping the channel region 131b in a plan view. The third transistors T3_1 and T3_2 may include the sub-transistors T3_1 and T3_2 connected to each other. The sub-transistor T3_1 includes the channel region 131c_1, the source region 136c_1, the drain region (137c_1), and a gate electrode 155c_1 which is a portion of the first scan line 151 overlapping the channel region 131c_1. The sub-transistor T3_2 includes the channel region 131c_2, the source region 136c_2, the drain region 137c_2, and a gate electrode 155c_2 which is a portion of the first scan line 151 overlapping the channel region 131c_2. The fourth transistor T4_1 and T4_2 may include the sub-transistor T4_1 and the sub-transistor T4_2 connected to each other. The sub-transistor T4_1 includes the channel region 131d_1, the source region 136d_1, the drain region 137d_1, and a gate electrode 155d_1 which is a portion of the second scan line 152 overlapping the channel region 131d_1. The sub-transistor T4_2 includes the channel region 131d_2, the source region 136d_2, the drain region 137d_2, and a gate electrode 155d_2 which is a portion of the second scan line 152 overlapping the channel region 131d_2. The fifth transistor T5 includes the channel region 131e, the source region 136e, the drain region 137e, and a gate electrode 155e which is a portion of the control line 153 overlapping the channel region 131e. The sixth transistor T6 includes the channel region 131f, the source region 136f, the drain region 137f, and a gate electrode 155f which is a portion of the control line 153 overlapping the channel region 131f. The seventh transistor T7 includes the channel region 131g, the source region 136g, the drain region 137g, and a gate electrode 155g which is a portion of the third scan line 154 overlapping the channel region 131g.

A second insulating layer 142 may be positioned on the first conductive layer and the first insulating layer 141, and a second conductive layer may be positioned on the second insulating layer 142. The second conductive layer may include a storage line 156 and an initialization voltage line 159 for transmitting an initialization voltage. The storage line 156 may include an extension portion 157 positioned at each pixel PX. Some of the extension portion 157 may be removed to form an opening 51.

A third insulating layer 160 may be positioned on the second conductive layer and the second insulating layer 142.

At least one of the barrier layer 120, the first insulating layer 141, the second insulating layer 142, and the third insulating layer 160 may include inorganic and/or organic insulating materials such as a silicon nitride (SiNx), a silicon oxide (SiOx), a silicon oxynitride (SiON), and the like. Some or all of the first insulating layer 141, the second insulating layer 142, and the third insulating layer 160 may include a plurality of contact holes (61, 62, 63, 64, 65, 67, 68, and 69).

A third conductive layer may be positioned on the third insulating layer 160. The third conductive layer may include the voltage transmitting line 177, the data line 171, and the driving voltage line 172 described above, and a plurality of connecting members 174, 175, and 179. The data line 171 and the driving voltage line 172 may substantially extend in the Y direction to cross the plurality of scan lines 151, 152, and 154.

A part of the connecting member 174 is connected to the driving gate electrode 155a through the opening 51 of the extension portion 157 of the storage line 156 and the contact hole 61 inside the opening 51, and another part of the connecting member 174 may be connected to the drain region 137c_1 of the sub-transistor T3_1 of the third transistor T3 and the drain region 137d_1 of the sub-transistor T4_1 of the fourth transistor T4 through the contact hole 63. The connecting member 175 may be connected to the initialization voltage line 159 through the contact hole 64, and may be connected to the drain region 137g of the seventh transistor T7 through the contact hole 65. The connecting member 179 may be connected to the drain region 137f of the sixth transistor T6 through the contact hole 69. The data line 171 may be connected to the source region 136b of the second transistor T2 through the contact hole 62, and the driving voltage line 172 may be connected to the source region 136e of the fifth transistor T5 through the contact hole 67 and to the extension portion 157 of the storage line 156 through the contact hole 68. Accordingly, the extension portion 157 of the storage line 156 may receive the driving voltage ELVDD of the driving voltage line 172.

At least one of the first conductive layer, the second conductive layer conductive layer, or the third conductive layer may include a conductive material such as copper (Cu), aluminum (Al), molybdenum (Mo), titanium (Ti), tantalum (Ta), and alloys of at least two among them.

The driving gate electrode 155a and the extension portion 157 of the storage line 156 that overlap each other with the second insulating layer 142 interposed therebetween may form the capacitor Cst.

A passivation layer 180 is positioned on the third conductive layer and the third insulating layer 160. The passivation layer 180 may have a contact hole 89 formed on the connecting member 179. The passivation layer 180 may include an inorganic insulating material and/or an organic insulating material such as a polyacrylic resin and a polyimide-based resin, and an upper surface of the passivation layer 180 may be substantially flat.

A pixel electrode layer is positioned on the passivation layer 180. The pixel electrode layer may include a pixel electrode 191, a pixel conductive pattern 192, and the like corresponding to each pixel PX of the display area DA. The pixel electrode 191 may be connected to the connecting member 179 through the contact hole 89 to receive a data voltage. The pixel conductive pattern 192 may be curved along an edge of the pixel electrode 191 adjacent thereto. The pixel conductive pattern 192 may transmit the initialization voltage. The pixel electrode layer may include a transflective conductive material or a reflective conductive material.

A pixel defining layer 350 is positioned on the passivation layer 180 and the pixel electrode layer. The pixel defining layer 350 may have an opening 351 formed on the pixel electrode 191. The pixel defining layer 350 may include a photosensitive material such as the polyacrylic resin or the polyimide-based resin.

An emission layer 370 is positioned on the pixel electrode 191. The emission layer 370 may include a portion positioned in the opening 351 of the pixel definition layer 350. The emission layer 370 may include an organic emission material and/or an inorganic emission material.

A common electrode 270 is positioned on the emission layer 370. The common electrode 270 may also be formed on the pixel definition layer 350 to be continuously formed over the plurality of pixels PX. The common electrode 270 may include a conductive transparent material.

The pixel electrode 191, the emission layer 370, and the common electrode 270 of each pixel PX together form a light emitting diode ED, wherein one of the pixel electrode 191 and the common electrode 270 becomes a cathode and the other becomes an anode.

Another substrate 210 may be positioned on the common electrode 270.

Now, cross-sectional structures of display panels according to various exemplary embodiments will be described with reference to FIG. 11 to FIG. 18 together with the above-described drawings. FIG. 11 to FIG. 18 respectively illustrate cross-sectional views taken along a line C1-C2 of the display panel 1000 shown in FIG. 1 described above. A repeated description for the same constituent elements as in the exemplary embodiments described above will be omitted.

Referring to FIG. 11 to FIG. 17, the peripheral area PA may include a transistor TRd, a voltage transmitting electrode 197, and a peripheral insulating layer 350P.

The transistor TRd may include terminals positioned on the same layer as the terminals of the above-described transistors (T1, T2, T3_1, T3_2, T4_1, T4_2, T5, T6, and T7). The transistor TRd is not directly connected to the light-emitting device.

The voltage transmitting electrode 197 is physically and electrically connected to the voltage transmitting line 177 to receive a common voltage. The voltage transmitting electrode 197 is physically and electrically connected to the common electrode 270 to be able to transmit the common voltage to the common electrode 270.

The peripheral insulating layer 350P may be positioned on the same layer as the above-described pixel defining layer 350, and may include the same material. The peripheral insulating layer 350P may cover a portion in which the voltage transmitting line 177 and the voltage transmitting electrode 197 contact each other and an edge of the passivation layer 180.

The seal 310 may be positioned between the two substrates 110 and 210 opposing each other, and may bond the two substrates 110 and 210 with each other.

Figure 11:
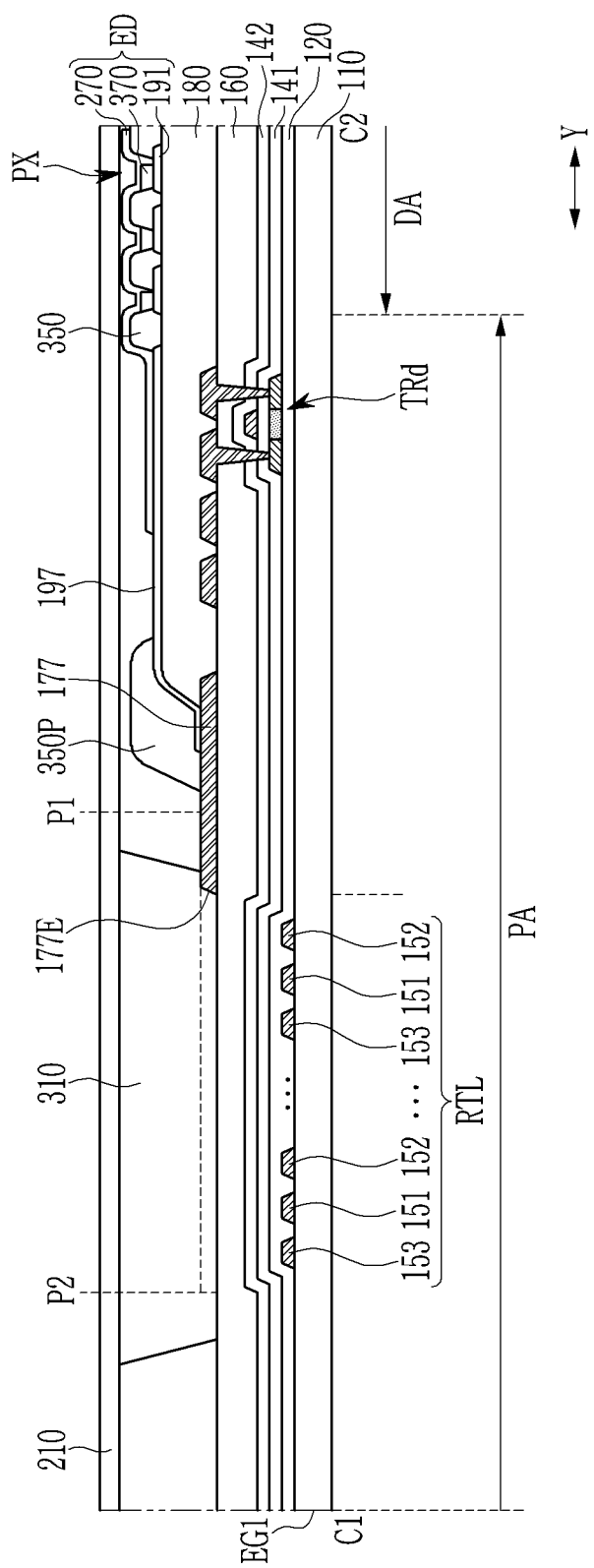

As shown in FIG. 11, an edge 177E of the voltage transmitting line 177 may or may not overlap the seal 310. Specifically, the edge 177E of the voltage transmitting line 177 may be positioned at various positions between a position P1 spaced apart from the seal 310 and a position P2 that is closer to the edge of the substrate 110 than the position P1. For example, when the edge 177E of the voltage transmitting line 177 is positioned at the position P1, the voltage transmitting line 177 may not overlap the seal 310 to be spaced apart therefrom, and when the edge 177E of the voltage transmitting line 177 is positioned at the position P2, the voltage transmitting line 177 may overlap most of the seal 310.

Referring to FIG. 11 to FIG. 18 together with FIG. 1, the output wires positioned in the second area A2 and the third area A3, that is, a part of the scan lines 151 and 152 and the control line 153 positioned in the peripheral area PA adjacent to the notch portion NTA, corresponds to the above-described connecting line unit (RTL). The connecting line unit (RTL) may include the above-described connecting lines 151C and 153C, and the connecting lines 151C and 153C may be a part of the scan lines 151 and 152 and the control line 153. In FIG. 11 to FIG. 18, for showing the disposition of the scan lines 151 and 152 and the control line 153, the connecting line unit (RTL) is denoted by the reference numerals of the scan lines 151 and 152 and the control line 153 instead of the reference numerals of the connecting lines 151C and 153C. As described above, the second scan line 152, the first scan line 151, and the control line 153 included in the connecting line unit (RTL) may be alternately arranged in the Y direction to be away from the display area DA. In addition, as described above, the third scan line 154 is substantially the same type of scan line as the second scan line 152, and in the display area DA as a whole, the second scan line 152, the first scan line 151, and the control line 153 are alternately disposed in the Y direction, and when the second scan line 152 is positioned on one pixel row, the second scan line 152 positioned on a next pixel row may correspond to the third scan line 154. Accordingly, hereinafter, a description for the third scan line 154 applies to that of the second scan line 152.

As described above, the connecting line unit (RTL) may be limited to be positioned at a part (e.g. at a predetermined part) of the peripheral area PA, and FIG. 11 to FIG. 18 show examples in which the connecting line unit (RTL) is positioned in an area overlapping the seal 310. When the voltage transmitting line 177 extends to overlap the seal 310, the connecting line unit (RTL) may overlap the voltage transmitting line 177 in addition to the seal 310, and when the voltage transmitting line 177 is spaced apart from the seal 310, the connecting line unit (RTL) may be spaced apart from the voltage transmitting line 177 in a plan view.

Figure 12:
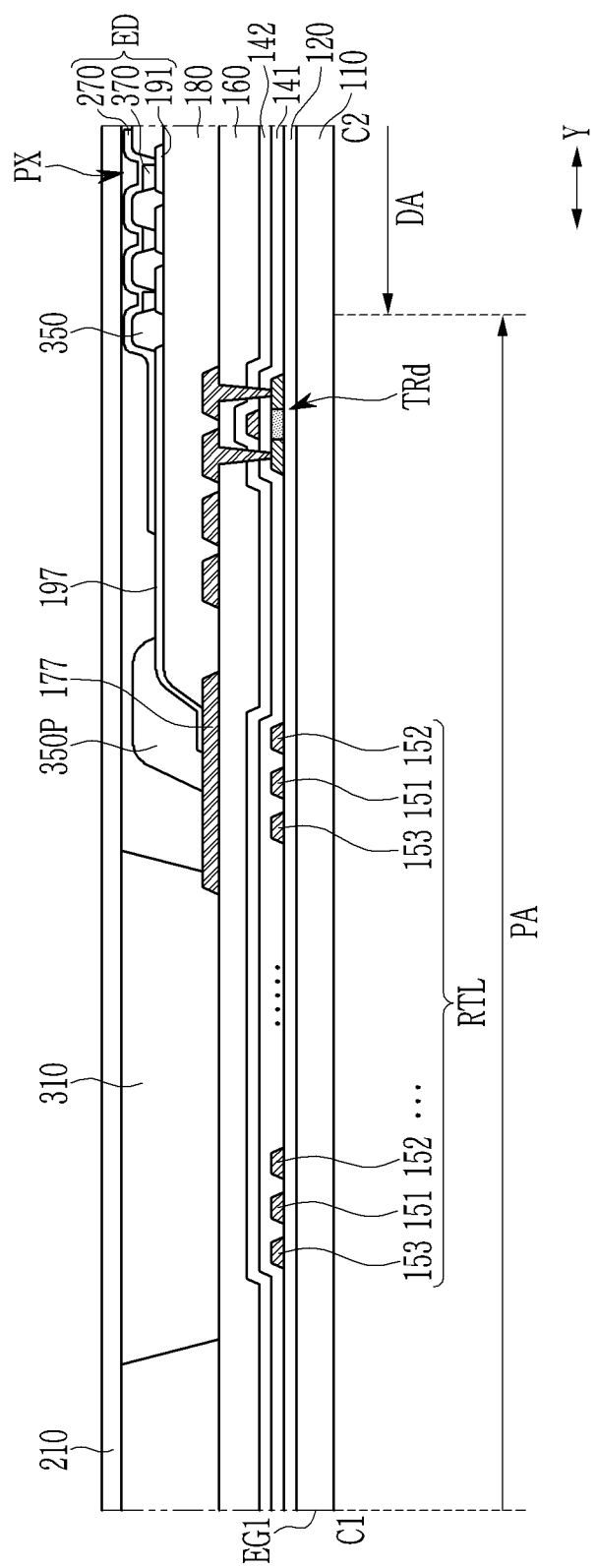
Figure 13:
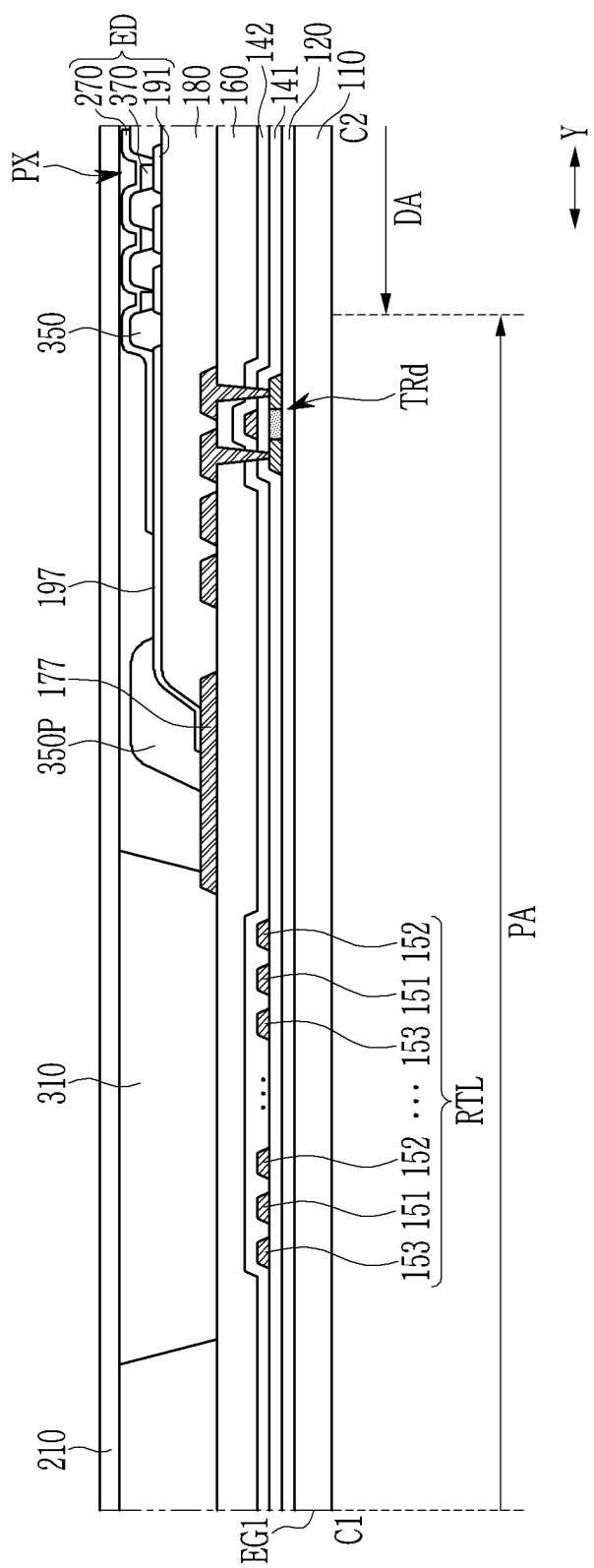
Figure 14:
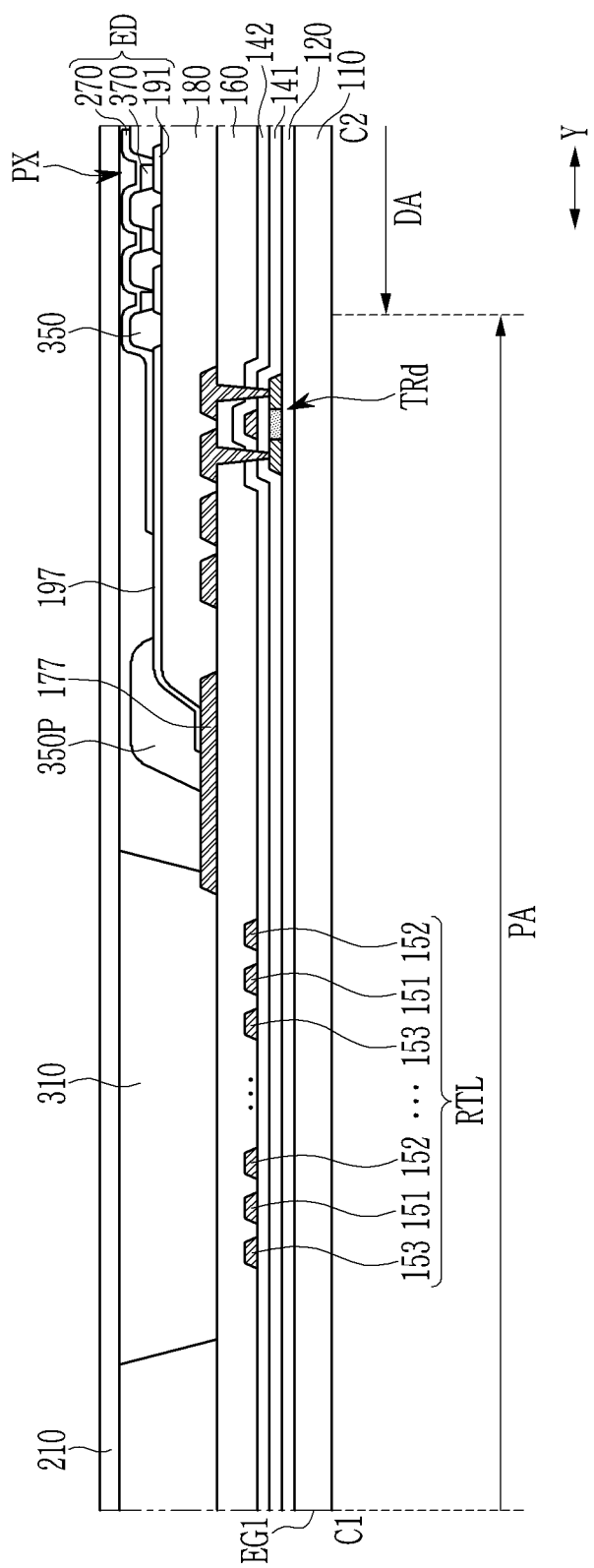
Figure 15:
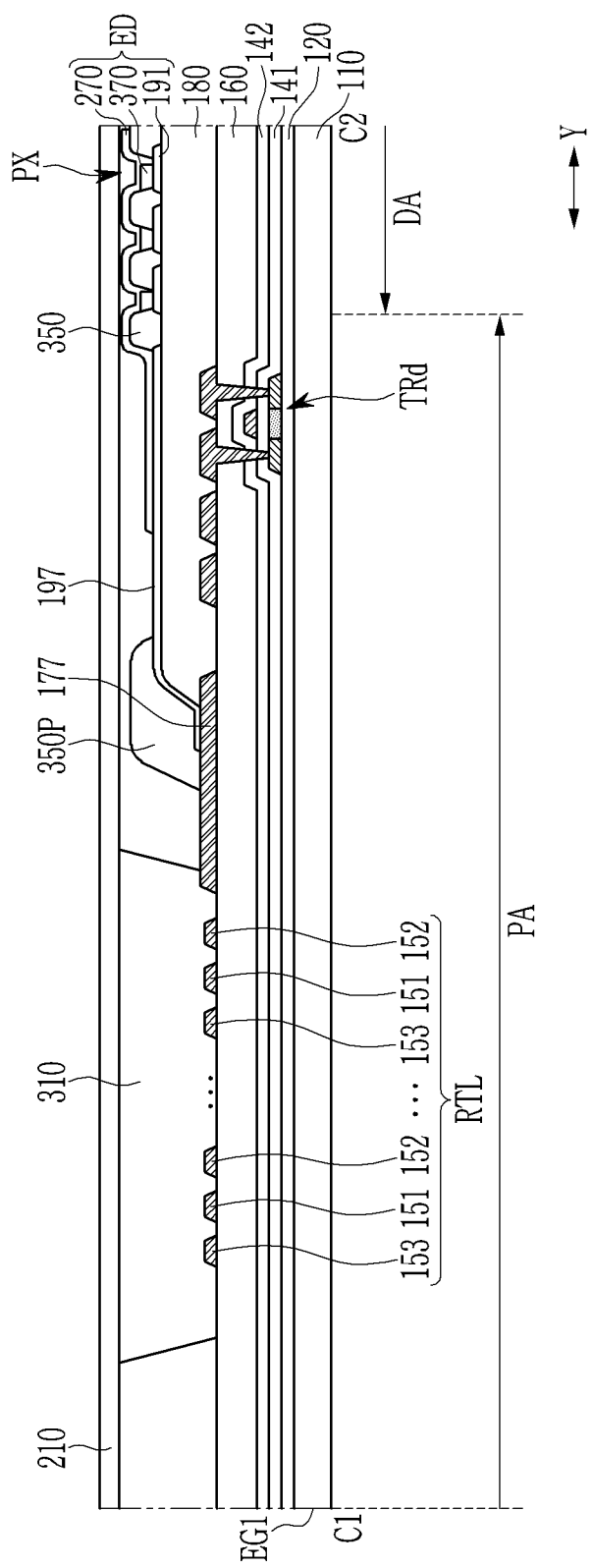

The connecting line unit (RTL) may be positioned at several conductive layers, and FIG. 11 shows an example in which the connecting line unit (RTL) is positioned between the substrate 110 and the barrier layer 120, FIG. 12 shows an example in which the connecting line unit (RTL) is positioned between the barrier layer 120 and the first insulating layer 141, FIG. 13 shows an example in which the connecting line unit (RTL) is positioned between the first insulating layer 141 and the second insulating layer 142, that is, at the first conductive layer, FIG. 14 shows an example in which the connecting line unit (RTL) is positioned between the second insulating layer 142 and the third insulating layer 160, that is, at the second conductive layer conductive layer, and FIG. 15 shows an example in which the connecting line unit (RTL) is positioned between the third insulating layer 160 and the passivation layer 180, that is, at the third conductive layer.

When the connecting line unit (RTL) is positioned at the area overlapping the seal 310, because a process in which high temperature heat (e.g., 600° C. or more) is applied to the seal 310 is included in manufacturing processes of the display panel, the connecting line unit (RTL) may be positioned at a conductive layer including a material (e.g., molybdenum) capable of withstanding a high temperature process.

Figure 16:
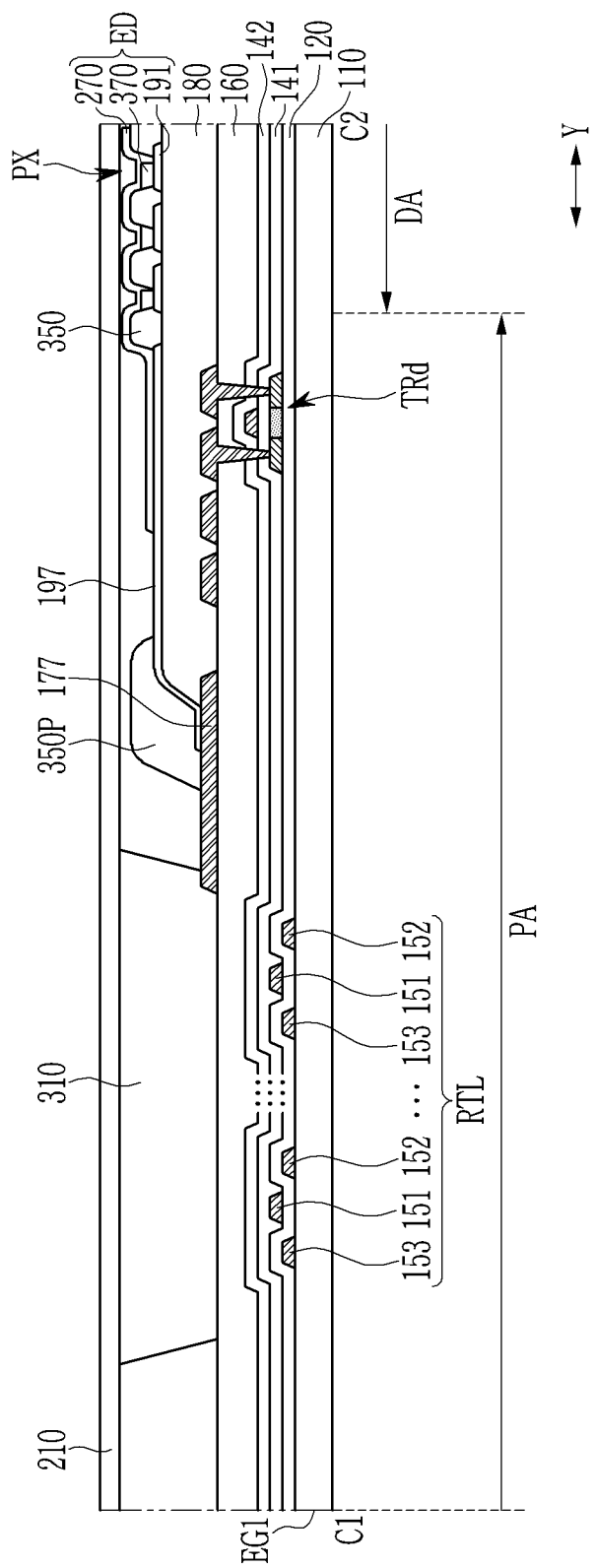
Figure 17:
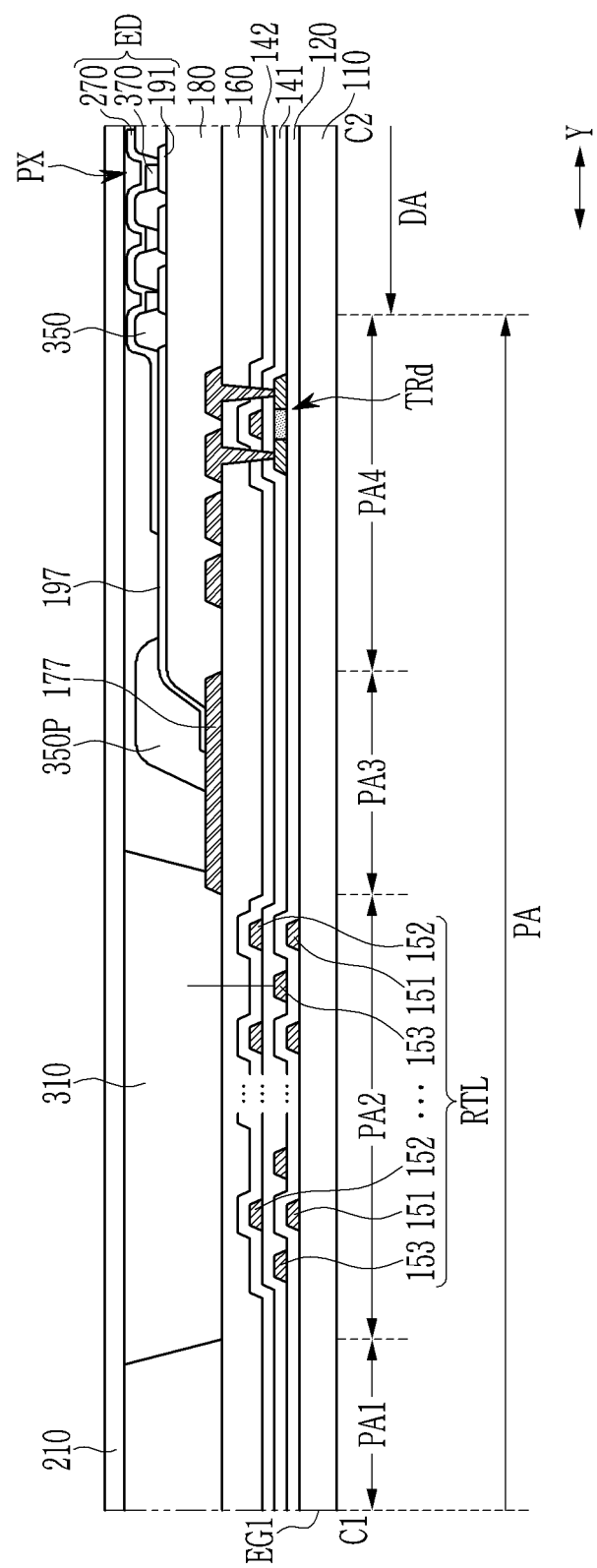

Referring to FIG. 16 and FIG. 17, the connecting line unit (RTL) may be positioned at two or more different conductive layers among the several conductive layers at which the connecting line unit (RTL) is positioned in FIG. 11 to FIG. 15.

Referring to FIG. 16, in the connecting line unit (RTL), the output wires may be alternately arranged in the Y direction, that is, the scan lines 151 and 152 and the control line 153, may be alternately positioned in different conductive layers (e.g., the conductive layer between the substrate 110 and the barrier layer 120 and the conductive layer between the barrier layer 120 and the first insulating layer 141). To avoid or reduce the risk of an electrical short, the different conductive layers may be selected as conductive layers that are vertically far away in a cross-sectional view such as the conductive layers between the substrate 110 and the barrier layer 120, and the third conductive layer.

Referring to FIG. 17, in a state in which three adjacent ones of the scan lines 151 and 152 and the control line 153 of the connecting line unit (RTL) are grouped into one group, two lines of the group may be positioned at different conductive layers so as to overlap each other in a plan view, and the remaining one thereof may be positioned at a different conductive layer from the above-mentioned different conductive layers. In this case, the connecting line unit (RTL) may be positioned at three different conductive layers among the conductive layers at which the connecting line unit (RTL) is positioned in FIG. 11 to FIG. 15. For example, the output wires adjacent to each other, that is, the scan lines 151 and 152 and the control line 153 adjacent to each other, may be grouped into one group, and one of the two scan lines 151 and 152 may be positioned at one conductive layer (e.g., the conductive layer between the substrate 110 and the barrier layer 120), another thereof may be positioned at another conductive layer (e.g., the first conductive layer), and the control line 153 may be positioned at another conductive layer (e.g., the conductive layer between the barrier layer 120 and the first insulating layer 141). Such a cross-sectional arrangement structure may be repeated in the Y direction.

When the number of the output wires positioned at the first and second display portions DA1 and DA2, that is, of the scan lines 151 and 152 and the control line 153, is large, or when the number of the scan lines 151 and 152 and the control line 153 included in the connecting line unit (RTL) is considerably large because the resolution of the display panel 1000 is high, a planar area required for disposing the connecting line unit (RTL) may be increased, however, according to the exemplary embodiment shown in FIG. 17, the planar area occupied by the connecting line unit (RTL) may be greatly reduced. Further, adjacent lines (e.g., three or more) of the output wires, that is, of the scan lines 151 and 152 and the control lines 153, are positioned at different conductive layers, and at least some thereof overlap each other in a plan view, thus the area of the connecting line unit (RTL) may be reduced.

When the output wires, that is, the scan lines 151 and 152 and/or the control line 153, are positioned at the first conductive layer in the display area DA as described above and are positioned at a different conductive layer from the first conductive layer in the peripheral area PA as shown in FIG. 11, FIG. 12, FIG. 14, and FIG. 15, two parts positioned at different conductive layers of the scan lines 151 and 152 and/or the control line 153 may be electrically connected to each other through a contact hole formed in some of the barrier layer 120, the first insulating layer 141, the second insulating layer 142, and the third insulating layer 160. The contact hole may be positioned in the peripheral area PA adjacent to a boundary between the display area DA and the peripheral area PA in a plan view, that is, to the edges DE4 and DE5 of the display area DA.

Although not shown in FIG. 11 to FIG. 18, as described above, the connecting line unit (RTL) may be positioned in a region not overlapping the seal 310. For example, the connecting line unit (RTL) may be positioned in a region overlapping the voltage transmitting line 177. In this case, the conductive layer at which the connecting line unit (RTL) is positioned may be a conductive layer excluding the third conductive layer. In addition, as shown in FIG. 12, the connecting line unit (RTL) may be distributed and positioned over the entire region at which the seal 310 and the voltage transmitting line 177 are positioned.

The transistor TRd shown in FIG. 11 to FIG. 18 is included in a circuit positioned in the upper peripheral area PA in the display panel 1000 shown in FIG. 1, and it may mainly be used in a circuit for checking defects of the display panel 1000. When the circuit for checking the defects is not positioned at the upper portion of the display panel 1000, the transistor TRd may be omitted. In this case, at least some of the connecting line unit (RTL) may be formed in a region in which the transistor TRd is positioned.

Figure 18:
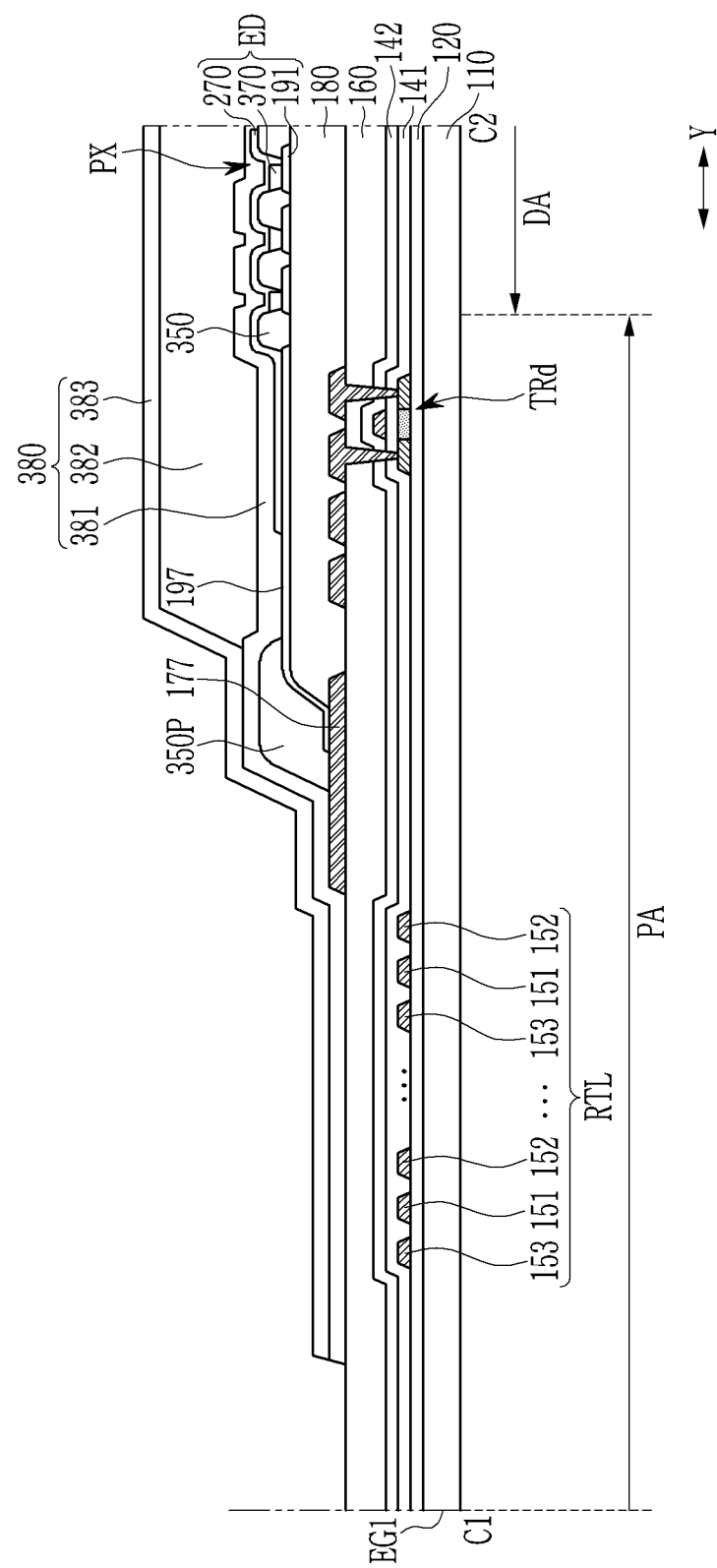

Referring to FIG. 18, although a display panel according to an exemplary embodiment is mostly the same as the exemplary embodiments shown in FIG. 11 to FIG. 17, the seal 310 and the substrate 210 may be omitted. In this case, an encapsulation portion 380 for protecting and sealing the light emitting diode ED may be positioned on the common electrode 270. The encapsulation portion 380 includes at least one of inorganic insulating layers 381 and 383 and at least one organic insulating layer 382, and the at least one of inorganic insulating layers 381 and 383 and the at least one organic insulating layer 382 may be alternately stacked. The organic insulating layer 382 may include an organic insulating material, and may have planarization characteristics. The inorganic insulating layer 381 or 383 may include an inorganic insulating material such as an aluminum oxide (AlOx), a silicon oxide (SiOx), a silicon nitride (SiNx), and a silicon oxynitride (SiON).

A display panel according to an exemplary embodiment will now be described with reference to FIG. 19 and FIG. 20 together with the above-described drawings. A description for the same constituent elements of the above-described embodiment will be omitted, and differences will be mainly described.

Figure 19:
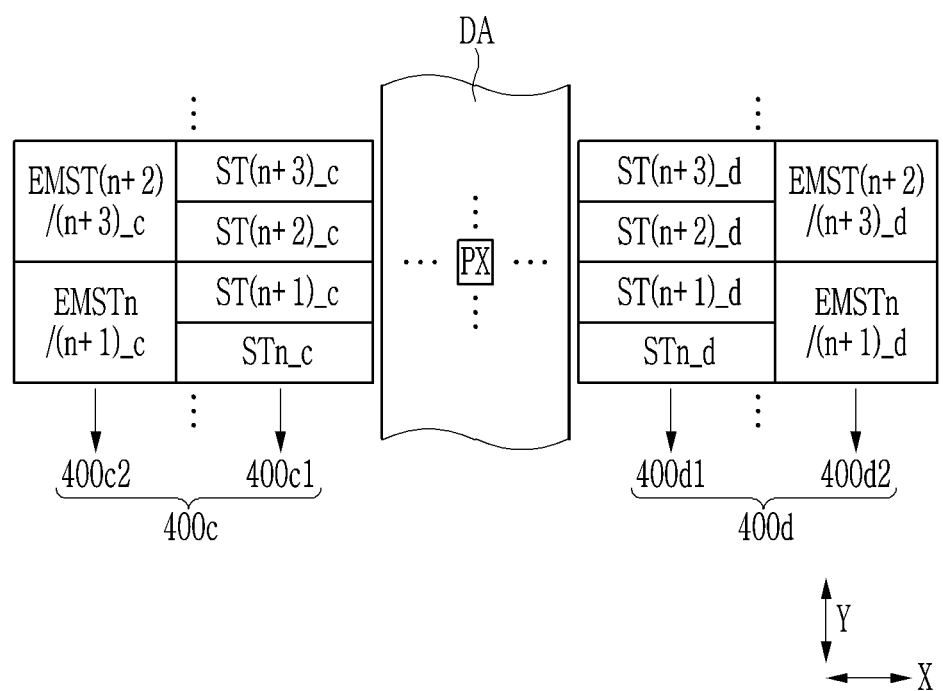
FIG. 19 illustrates a layout view of some of a driver of a display panel according to an exemplary embodiment.

Referring to FIG. 19 and FIG. 20, instead of the above-described gate drivers 400a and 400b, gate drivers 400c, 400d, 400e, and 400f may be positioned in the left and right peripheral areas PA of the display panel. A structure of the gate drivers 400e and 400f positioned in the first area A1 and positioned in the second area A2 and a structure of the gate drivers 400c and 400d positioned in the third area A3 may be different.

For example, the structure of the gate driver 400e and 400f may be the same as that of the above-described gate drivers 400a and 400b. That is, the gate driver 400e positioned at one side with respect to the display area DA and the gate driver 400f positioned at the other side may have different structures, and they may have asymmetrical structures with respect to each other. The gate driver 400*e* positioned at one side with respect to the display area DA may be connected to the scan lines 151 and 152 to input the scan signal, and the gate driver 400*f* positioned at the other side may connected to the control line 153 to include a second sub-driver (not shown) capable of inputting a control signal. The gate driver 400*f* may be connected to the scan lines 151 and 152 to further include a first sub-outputting the same scan signal as that outputted by the gate driver 400*e*. As such, in the first area A1, the gate drivers 400*e* and 400*f* positioned in the peripheral area PA at opposite sides with respect to the display area DA are formed to have an asymmetrical structure like the above-described gate drivers 400*a* and 400*b*, thus the area of the left and right peripheral areas PA, that is, a bezel area, may be further reduced.

The gate drivers 400*c* and 400*d* positioned in the second area A2 and the third area A3 may have a symmetrical structure to each other. Referring to FIG. 19, the gate driver 400*c* may include a first sub-driver 400*c*1 including a plurality of stages ( . . . , STn_c, ST(n+1)_c, . . . ) that are sequentially arranged, and similar to this, the gate driver 400*d* may include a first sub-driver 400*d* 1 including a plurality of stages ( . . . , STn_d, ST(n+1)_d, . . . ) that are sequentially arranged. The plurality of stages ( . . . , STn_c, ST(n+1)_c, . . . ) of the first sub-driver 400*c*1 and the plurality of stages ( . . . , STn_d, ST(n+1)_d, . . . ) of the first sub-driver 400*d* 1 may respectively oppose each other to correspond to each other. The first sub-driver 400*c*1 and the first sub-driver 400*d*1 may have the same size, and may have structures that are symmetrical to each other.

The first sub-driver 400*c*1 of the gate driver 400*c* may be connected to the scan lines 151 and 152 positioned at the first display portion DA1 that is positioned at one side with respect to the notch portion NTA to input the scan signal, and the first sub-driver 400*d* 1 of the gate driver 400*d* may be connected to the scan lines 151 and 152 positioned at the second display portion DA2 that is positioned at the other side with respect to the notch portion NTA to input the scan signal. Accordingly, the scan lines 151 and 152 respectively positioned at the first and second display portions DA1 and DA2 need not be connected to each other.

The gate driver 400*c* may include a second sub-driver 400*c*2 including a plurality of stages ( . . . , EMSTn/(n+1)_c, . . . ) that are sequentially arranged, and the gate driver 400*d* may include a second sub-driver 400*d*2 including a plurality of stages ( . . . , EMSTn/(n+1)_d, . . . ) that are sequentially arranged. The plurality of stages ( . . . , EMSTn/(n+1)_c, . . . ) of the second sub-driver 400*c*2 and the plurality of stages ( . . . , EMSTn/(n+1)_d, . . . ) of the second sub-driver 400*d*2 may respectively oppose each other to correspond to each other. The second sub-driver 400*c*2 and the second sub-driver 400*d*2 may have the same size, and may have structures that are symmetrical to each other.

The second sub-driver 400*c*2 of the gate driver 400*c* may be connected to the control line 153 positioned at the first display portion DA1 that is positioned at one side with respect to the notch portion NTA to input the control signal, and the second sub-driver 400*d*2 of the gate driver 400*d* may be connected to the control line 153 positioned at the second display portion DA2 that is positioned at the other side with respect to the notch portion NTA to input the control signal. Accordingly, the control lines 153 respectively positioned at the first and second display portions DA1 and DA2 need not be connected to each other. However, in order to match the load of the control line 153 positioned in the first area A1 with the load of the control line 153 positioned in the second area A2 and the third area A3, the control line 153 positioned in the third area A3 may be connected to the dummy line 153L described above. In addition, the control line 153 positioned in the second area A2 may include a connecting line 153S that is positioned in the peripheral area PA adjacent to the notch portion NTA and that connects the two control lines 153 positioned at the first and second display portions DA1 and DA2 to each other. Like the control lines 153 positioned at the first and second display portions DA1 and DA2, the connecting line 153S may substantially extend in the X direction.

The display panel according to the exemplary embodiments described above may be included in various devices such as a tablet PC and a mobile phone, and the devices may be various display devices such as a liquid crystal display in addition to organic and inorganic light emitting diode displays.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display panel comprising:
a first substrate having a display area and a peripheral area outside the display area;
a plurality of pixels at the display area;
a plurality of first output wires and a plurality of second output wires connected to the plurality of pixels, at least one pixel of the plurality of pixels being connected to one of the first output wires and connected to one of the second output wires;
a first driver at a first peripheral area of the peripheral area at a first side of the display area, the first driver being connected to the plurality of first output wires and not connected to the plurality of second output wires; and
a second driver at a second side opposing the first side with respect to the display area in the peripheral area, the second driver being spaced apart from the first driver along a first direction,
wherein the second driver has a first sub-driver connected to the plurality of first output wires and a second sub-driver connected to the plurality of second output wires,
wherein the first substrate comprises a notch portion having a curved edge,
wherein the display area comprises a first display portion and a second display portion that are spaced apart from each other with the notch portion interposed between the first display portion and the second display portion, and
wherein at least one of the plurality of first output wires comprises:
a first main line at the first display portion;
a second main line at the second display portion; and
a first connecting line that is connected to the first main line and the second main line and is at the peripheral area between the first display portion and the second display portion.

2. The display panel of claim 1, wherein
at least one of the first main line or the second main line extends in the first direction, and
the notch portion has a first edge, a second edge and a third edge, wherein the second edge and the third edge are respectively at opposite sides of the first edge and respectively extend in a direction crossing the first direction.

3. The display panel of claim 2, wherein:
the first connecting line comprises a portion extending along the notch portion.

4. The display panel of claim 1, further comprising:
a second substrate opposing the first substrate; and
a seal between the first substrate and the second substrate and bonding the first substrate and the second substrate with each other,
wherein the first connecting line overlaps the seal.

5. The display panel of claim 4, further comprising:
a voltage transmitting line in the peripheral area, the voltage transmitting line extending along at least three edges of the display area and transmitting a common voltage,
wherein the first connecting line overlaps the voltage transmitting line.

6. The display panel of claim 1, wherein at least one of the plurality of second output wires comprises:
a third main line at the first display portion;
a fourth main line at the second display portion; and
a second connecting line connected to the third main line and the fourth main line, the second connecting line being at the peripheral area between the first display portion and the second display portion.

7. The display panel of claim 6, wherein
at least one of the third main line and the fourth main line is connected to a dummy line at the peripheral area, the dummy line including a portion extending parallel to the third main line or the fourth main line.

8. The display panel of claim 6, wherein
the first connecting line and the second connecting line are at a same conductive layer over the first substrate.

9. The display panel of claim 6, wherein
the first connecting line and the second connecting line are at different conductive layers from each other over the first substrate.

10. The display panel of claim 9, wherein
the first connecting line and the second connecting line that are sequentially arranged in a plan view are alternately positioned at the different conductive layers.

11. The display panel of claim 10, wherein
the first connecting line and the second connecting line overlap each other in the plan view, and are positioned at different conductive layers from each other.

12. The display panel of claim 1, wherein
the plurality of first output wires comprise a scan line or a control line.

13. A display panel comprising:
a first display area;
a second display area and a third display area that are extended from the first display area in a first direction and are spaced apart from each other in a second direction different from the first direction;
a peripheral area around an entire display area that comprises the first display area, the second display area, and the third display area;
a first driver at a first peripheral area of the peripheral area at a first side of the entire display area;
a second driver at a second side of the peripheral area opposing the first side with respect to the entire display area and having a first sub-driver and a second sub-driver;
a plurality of first signal lines connected to the first driver and the first sub-driver of the second driver; and
a plurality of second signal lines connected to the second sub-driver of the second driver and not connected to the first driver,
wherein the first display area, the second display area, and the third display area comprise at least one pixel connected to one of the first signal lines and connected to one of the second signal lines, and
wherein one signal line of the plurality of first signal lines and the plurality of second signal lines comprises:
a first portion at the second display area;
a second portion at the third display area; and
a third portion at a second peripheral area of the peripheral area between the second display area and the third display area, the third portion connecting the first portion and the second portion to each other.

14. The display panel of claim 13, wherein:
the third portion includes a portion extending along a periphery of the second display area and the third display area.

15. The display panel of claim 1, wherein
the second driver has a different area than the first driver,
the second driver has a different width along a first direction than the first driver, and
the first direction is the same as an extending direction of one of the plurality of first output wires and the plurality of second output wires.

16. The display panel of claim 13, wherein
the second driver has a different area than the first driver, and
the second driver has a different width along the second direction than the first driver.

* * * * *